(12) United States Patent
Kono

(10) Patent No.: US 11,101,259 B2
(45) Date of Patent: Aug. 24, 2021

(54) SEMICONDUCTOR DEVICE

(71) Applicant: DENSO CORPORATION, Kariya (JP)

(72) Inventor: Kenji Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 29 days.

(21) Appl. No.: 16/695,422

(22) Filed: Nov. 26, 2019

(65) Prior Publication Data

US 2020/0126962 A1  Apr. 23, 2020

Related U.S. Application Data

(63) Continuation of application No. PCT/JP2018/028143, filed on Jul. 26, 2018.

(30) Foreign Application Priority Data

Jul. 26, 2017 (JP) .............................. JP2017-144727
Jun. 20, 2018 (JP) .............................. JP2018-117317

(51) Int. Cl.
| | | |
|---|---|---|
| *H01L 29/15* | (2006.01) | |
| *H01L 25/18* | (2006.01) | |
| *H01L 23/31* | (2006.01) | |
| *H01L 23/34* | (2006.01) | |
| *H01L 23/367* | (2006.01) | |
| *H01L 23/00* | (2006.01) | |
| *H01L 25/07* | (2006.01) | |

(52) U.S. Cl.
CPC .......... *H01L 25/18* (2013.01); *H01L 23/3114* (2013.01); *H01L 23/34* (2013.01); *H01L 23/367* (2013.01); *H01L 24/40* (2013.01); *H01L 25/072* (2013.01); *H01L 2224/24137* (2013.01); *H01L 2924/10253* (2013.01); *H01L 2924/10272* (2013.01); *H01L 2924/1203* (2013.01); *H01L 2924/1207* (2013.01); *H01L 2924/13062* (2013.01); *H01L 2924/13091* (2013.01)

(58) Field of Classification Search
CPC ... H01L 25/072; H01L 25/18; H01L 23/3114; H01L 23/367; H01L 2924/13062; H01L 2924/13091
See application file for complete search history.

(56) References Cited

U.S. PATENT DOCUMENTS

| | | |
|---|---|---|
| 4,663,547 A | 5/1987 | Baliga et al. |
| 5,406,096 A | 4/1995 | Malhi |
| 6,614,281 B1 | 9/2003 | Baudelot et al. |

(Continued)

FOREIGN PATENT DOCUMENTS

| | | |
|---|---|---|
| JP | 2013-153079 A | 8/2013 |
| JP | 2014-220434 A | 11/2014 |

(Continued)

*Primary Examiner* — Phuc T Dang
(74) *Attorney, Agent, or Firm* — Posz Law Group, PLC

(57) ABSTRACT

A semiconductor device includes: a first semiconductor chip including a junction-type FET; a second semiconductor chip including a MOSFET; and a junction-type FET adjustment resistor disposed between a gate electrode of the junction-type FET and a source electrode of the MOSFET. The junction type FET and the MOSFET are cascode-connected. The junction-type FET adjustment resistor includes a first resistance circuit for a switching on operation and a second resistance circuit for a switching off operation.

17 Claims, 21 Drawing Sheets

(56) References Cited

U.S. PATENT DOCUMENTS

| | | |
|---|---|---|
| 2011/0199148 A1* | 8/2011 | Iwamura ............... H03K 17/567 |
| | | 327/430 |
| 2012/0105131 A1 | 5/2012 | Biela et al. |
| 2014/0225124 A1 | 8/2014 | Otremba et al. |
| 2014/0231829 A1* | 8/2014 | Kanazawa ............... H01L 24/41 |
| | | 257/77 |
| 2014/0346570 A1 | 11/2014 | Ueno |
| 2016/0133597 A1 | 5/2016 | Kouno |
| 2016/0155726 A1 | 6/2016 | Kanazawa et al. |
| 2016/0315075 A1* | 10/2016 | Toyoda .................... H01L 25/18 |
| 2018/0122720 A1* | 5/2018 | Hable ..................... H01L 24/48 |

FOREIGN PATENT DOCUMENTS

| | | |
|---|---|---|
| JP | 2015-056564 A | 3/2015 |
| JP | 2017-051049 A | 3/2017 |
| WO | 2015/114728 A1 | 8/2015 |
| WO | 2015/166523 A1 | 11/2015 |

\* cited by examiner

SEMICONDUCTOR DEVICE

CROSS REFERENCE TO RELATED APPLICATION

The present application is a continuation application of International Patent Application No. PCT/JP2018/028143 filed on Jul. 26, 2018, which designated the U.S. and claims the benefit of priority from Japanese Patent Applications No. 2017-144727 filed on Jul. 26, 2017, and No. 2018-117317 filed on Jun. 20, 2018. The entire disclosures of all of the above applications are incorporated herein by reference.

TECHNICAL FIELD

The present disclosure relates to a semiconductor device.

BACKGROUND

Conventionally, a semiconductor device has a first semiconductor chip in which a normally-on type JFET is formed and a second semiconductor chip in which a normally-off type MOSFET is formed. Specifically, in this semiconductor device, the JFET and the MOSFET are cascode-connected, and the source electrode of the MOSFET and the gate electrode of the JFET are connected via one resistor that adjusts the switching speed.

SUMMARY

According to an example embodiment, a semiconductor device includes: a first semiconductor chip including a junction-type FET; a second semiconductor chip including a MOSFET; and a junction-type FET adjustment resistor disposed between a gate electrode of the junction-type FET and a source electrode of the MOSFET. The junction-type FET and the MOSFET are cascode-connected. The junction-type FET adjustment resistor includes a first resistance circuit for a switching on operation and a second resistance circuit for a switching off operation.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
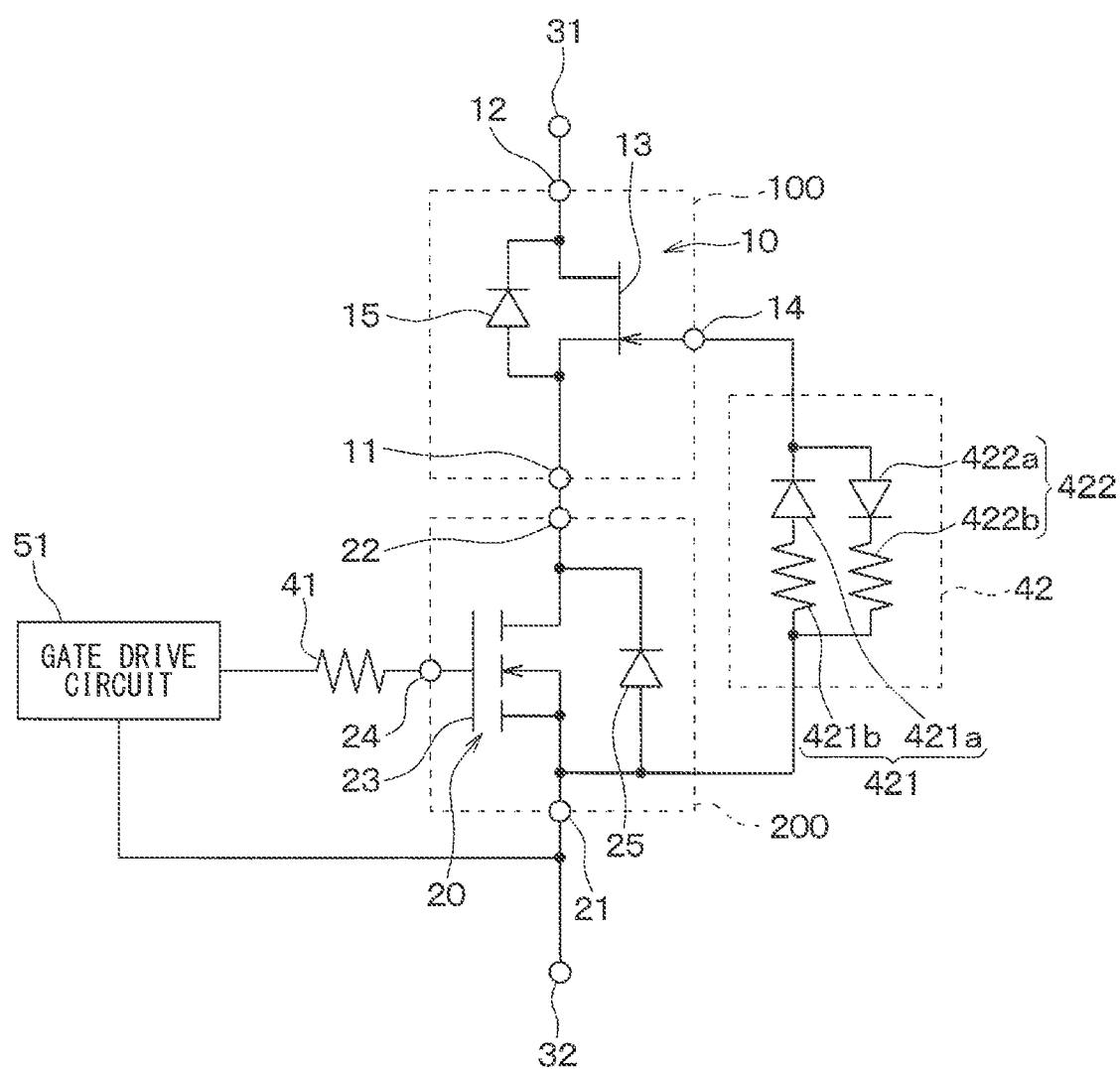
FIG. 1 is a circuit diagram of a semiconductor device according to a first embodiment.

The present embodiments relate to a semiconductor device having a first semiconductor chip in which a junction-type FET (Field Effect Transistor: hereinafter simply referred to as JFET) is formed and a second semiconductor chip in which a MOSFET (Metal Oxide Semiconductor Field Effect Transistor) is formed.

In a conceivable semiconductor device, the JFET and the MOSFET are cascode-connected, and the source electrode of the MOSFET and the gate electrode of the JFET are connected via one resistor that adjusts the switching speed.

In the semiconductor device, for example, when a predetermined gate voltage is applied to the gate electrode of the MOSFET, a current flows through the MOSFET and the JFET, and the semiconductor device turns on. In addition, when a gate voltage (for example, 0 V) lower than a predetermined voltage is applied to the gate electrode of the MOSFET, the semiconductor device turns off so that no current flows through the MOSFET and the JFET.

In the semiconductor device, the switching speed is adjusted by controlling the resistance of the resistor disposed between the source electrode of the MOSFET and the gate electrode of the JFET. In the following, the state in which current flows through the JFET and MOSFET is also referred to as the semiconductor device being in an on state, and the state in which the current flowing through the JFET and MOSFET is interrupted (that is, no current flows) is referred to the semiconductor device being in an off state.

However, the semiconductor device as described above includes only one resistor for adjusting the switching speed of the JFET. Therefore, a common resistor is used when the semiconductor device turns on and turns off. Therefore, in the semiconductor device, it is difficult to adjust to a desired switching speed in each of switching to the on state and switching to the off state.

In addition, the period when the semiconductor device becomes the on-state is defined as the period when the semiconductor device is switching from the off-state to the on-state (that is, a transient state), and hereinafter also referred to as a switching-on operation state. The period when the semiconductor device becomes the off-state is defined as the period when the semiconductor device is switching from the on-state to the off-state (that is, a transient state), and hereinafter also referred to as a switching-off operation state.

An example embodiment is to provide a semiconductor device, in which the JFET and the MOSFET are cascode-connected to each other, adjusting a switching speed at the switching-on operation state and a switching speed at the switching-off operation state.

According to an example embodiment, a semiconductor device includes a first semiconductor chip in which a JFET is arranged, a second semiconductor chip in which a MOSFET is arranged, and a JFET adjustment resistor disposed between a gate electrode of the JFET and a source electrode of the MOSFET. The JFET and the MOSFET are connected in a cascode connection by coupling a source electrode of the JFET and a drain electrode of the MOSFET, and the JFET adjustment resistor includes a first resistor circuit for a switching on operation and a second resistor circuit for a switching off operation.

According to this, the JFET adjustment resistor disposed between the source electrode of the MOSFET and the gate electrode of the JFET has the first resistance circuit for the switching on operation and the second resistance circuit for the switching off operation. For this reason, in the case of performing the switching-on operation and the case of performing the switching-off operation, it is possible to individually adjust so as to achieve a desired switching speed.

Incidentally, reference numerals with parentheses attached to the respective constituent elements and the like indicate an example of a correspondence relationship between the constituent elements and specific constituent elements described in the embodiment described later.

Hereinafter, embodiments of the present disclosure will be described with reference to the drawings. In each embodiment described below, same or equivalent parts are designated with the same reference numerals.

First Embodiment

A first embodiment will be described with reference to the drawings. First, the circuit configuration of the semiconductor device of this embodiment will be described. As shown in FIG. 1, in the semiconductor device of this embodiment, a normally-on type JFET 10 in which a first semiconductor chip 100 is formed and a normally-off type MOSFET 20 in which a second semiconductor chip 200 is formed are cascode-connected. In the present embodiment, each of the JFET 10 and the MOSFET 20 is an N channel type device.

The JFET 10 has a source electrode 11, a drain electrode 12, and a gate layer (that is, a gate electrode) 13, and a detailed configuration will be described later. The MOSFET 20 has a source electrode 21, a drain electrode 22, and a gate electrode 23, and a detailed configuration will be described later.

In the JFET 10 and the MOSFET 20, the source electrode 11 of the JFET 10 and the drain electrode 22 of the MOSFET 20 are electrically connected. The drain electrode 12 of the JFET 10 is connected to the first terminal 31, and the source electrode 21 of the MOSFET 20 is connected to the second terminal 32.

The gate electrode 23 of the MOSFET 20 is connected to the gate drive circuit 51 via the MOSFET adjustment resistor 41 and the gate pad 24. The gate layer 13 of the JFET 10 is electrically connected to the source electrode 21 of the MOSFET 20 via the JFET adjustment resistor 42 and the gate pad 14.

In this embodiment, the JFET adjustment resistor 42 includes a first resistance circuit 421 in which a first diode 421a and a first resistor 421b are connected in series, and a second resistance circuit 422, in which a second diode 422a and a second resistor 422b are connected in series. The first resistance circuit 421 and the second resistance circuit 422 are arranged in parallel so that the cathode of the first diode 421a and the anode of the second diode 422a are connected to the gate layer 13 of the JFET 10, respectively.

The JFET adjustment resistor 42 according to the present embodiment is a packaged component including the first resistance circuit 421 and the second resistance circuit 422, and is an external component configured by a different component different from the first semiconductor chip 100 and the second semiconductor chip 200. In the present embodiment, the first resistor 421b has a larger resistance than the second resistor 422b. Specifically, the first resistor 421b controls the switching speed when the semiconductor device turns on as will be described later, and has a resistance value corresponding to a desired and required application.

In the present embodiment, the gate layer 13 of the JFET 10 and the source electrode 21 of the MOSFET 20 are connected via the above JFET adjustment resistor 42. For this reason, the gate current of the JFET 10 is adjusted by different resistance circuits when the switching-on operation is performed and when the switching-off operation is performed. That is, in the semiconductor device of this embodiment, the switching speed is adjusted by different resistance circuits when the switching-on operation is performed and when the switching-off operation is performed.

Figure 5:
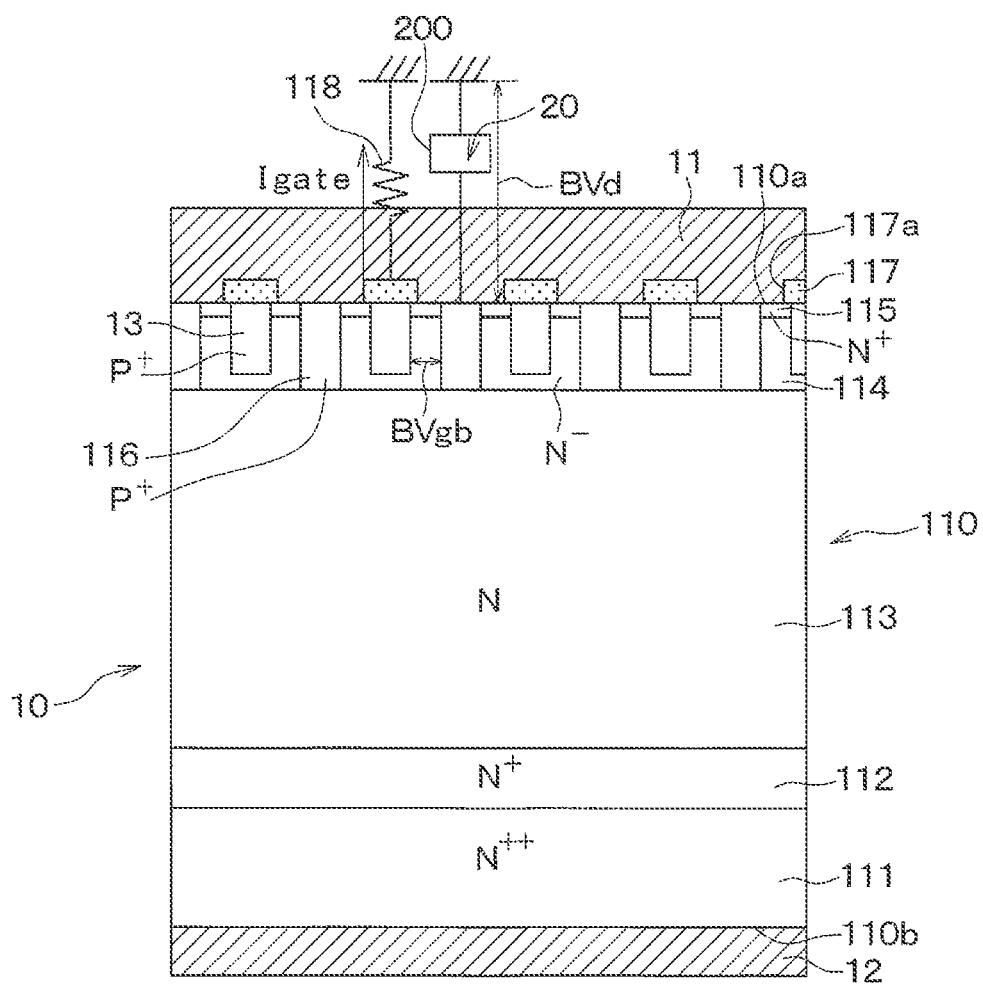
FIG. 5 is a cross-sectional view taken along line V-V in FIG. 4.

In the present embodiment, a diode 15 is connected between the drain electrode 12 and the source electrode 11 of the JFET 10. Although specifically described later, in the JFET 10, as shown in FIG. 5, a P type body layer 116 is formed in an N− type channel layer 114. The diode 15 includes the body layer 116. The diode 15 has a cathode electrically connected to the drain electrode 12 and an anode electrically connected to the source electrode 11.

A diode 25 is connected between the drain electrode 22 and the source electrode 21 of the MOSFET 20. The diode 25 is a parasitic diode formed on the configuration of the MOSFET 20, and has a cathode electrically connected to the drain electrode 22 and an anode electrically connected to the source electrode 21.

The circuit configuration of the semiconductor device according to the present embodiment is described above. Next, the basic operation of the semiconductor device connected in cascode in this way will be described. Since such a semiconductor device includes the MOSFET 20 that is a normally off type device, the semiconductor device operates as a normally off type device as a whole.

First, in order to turn on the semiconductor device by the switching-on operation, for example, a positive voltage is applied to the first terminal 31 and the second terminal 32 is grounded. A predetermined positive gate voltage is applied from the gate drive circuit 51 to the gate electrode 23 of the MOSFET 20. As a result, the normally-off type MOSFET 20 turns on. In the JFET 10, the gate layer 13 is connected to the second terminal 32. For this reason, the normally-on type JFET 10 turns on because the potential difference between the gate layer 13 and the source electrode 11 is almost zero. Therefore, a current flows between the first terminal 31 and the second terminal 32, and the semiconductor device finally turns on.

Note that when the JFET 10 performs a switching-on operation, the gate charging current of the JFET is adjusted by the first resistance circuit 421 (that is, the first resistor 421b). That is, in the present embodiment, when the JFE 10 performs a switching-on operation, the gate layer 13 is connected to the second terminal 32 via the first resistance circuit 421. That is, the first resistance circuit 421 functions as a speed adjustment resistor for the switching-on operation in the JFET 10.

Here, in the cascode circuit, in general, an element having a high breakdown voltage is arranged on an upper side. Thus, the JFET 10 has a breakdown voltage higher than the MOSFET 20. For this reason, in the cascode circuit, the following phenomenon may occur when the speed of the switching-on operation is adjusted using the MOSFET adjustment resistor 41. That is, since the JFET 10 has a higher breakdown voltage than the MOSFET 20, when the JFET 10 turns on even a little, the MOSFET 20 in the transition state from the off-state to the on-state breaks down and turns on at once. That is, in such a cascode circuit, it is difficult to adjust the speed of the switching-on operation by the MOSFET adjustment resistor 41. Therefore, the speed adjustment of the switching-on operation in the cascode circuit is preferably adjusted by the first resistance circuit 421 while fixing the value of the MOSFET adjustment resistor 41. In this case, the MOSFET adjustment resistor 41 is preferably set to a relatively small value so that the MOSFET 20 quickly turns on.

Next, when performing the switching off operation to turn off the semiconductor device, a positive voltage is applied to the first terminal 31, and a gate voltage applied to the gate electrode 23 of the MOSFET 20 is reduced (for example, the gate voltage becomes zero voltage) while the second terminal 32 remains grounded. As a result, the normally-off type MOSFET 20 becomes an off state. Further, when the MOSFET 20 becomes an off state, the voltage of the drain electrode 22 of the MOSFET 20 and the voltage of the source electrode 11 of the JFET 10 connected thereto increases, and an electric potential is generated between the gate layer 13 of the JFET 10 connected to the second terminal 32 and the source electrode 11. Then, when the potential difference between the source electrode 11 and the gate layer 13 reaches the threshold value, the JFET 10 turns off. As a result, no current flows between the first terminal 31 and the second terminal 32, and the semiconductor device finally turns off.

Note that when the JFET 10 performs a switching-off operation, the gate charging current of the JFET 10 is adjusted by the second resistance circuit 422 (that is, the second resistor 422b). That is, in the present embodiment, when the JFE 10 performs a switching-off operation, the gate layer 13 is connected to the second terminal 32 via the second resistance circuit 422. That is, the second resistance circuit 422 functions as a speed adjustment resistor for the switching-off operation in the JFET 10.

Here, the speed adjustment of the switching-off operation in the cascode circuit is preferably adjusted by the MOSFET adjustment resistor 41, which is different from the switching-on operation. This is because if the speed of the switching-off operation is adjusted by the second resistance circuit 422, even when the MOSFET 20 turns off, the MOSFET 20 may break down and the reliability may be lowered unless the JFET 10 is completely in the off state. Therefore, the speed adjustment of the switching-off operation in the cascode circuit is preferably adjusted by fixing the value of the second resistor 422b in the second resistor circuit 422 and using the MOSFET adjustment resistor 41. In this case, the second resistor 422b is preferably set to a relatively small value so that the JFET 10 quickly turns off.

The above description is the operation of the semiconductor device in this embodiment. Next, the configuration of the semiconductor device of this embodiment will be described with reference to FIGS. 2 and 3.

Figure 2:
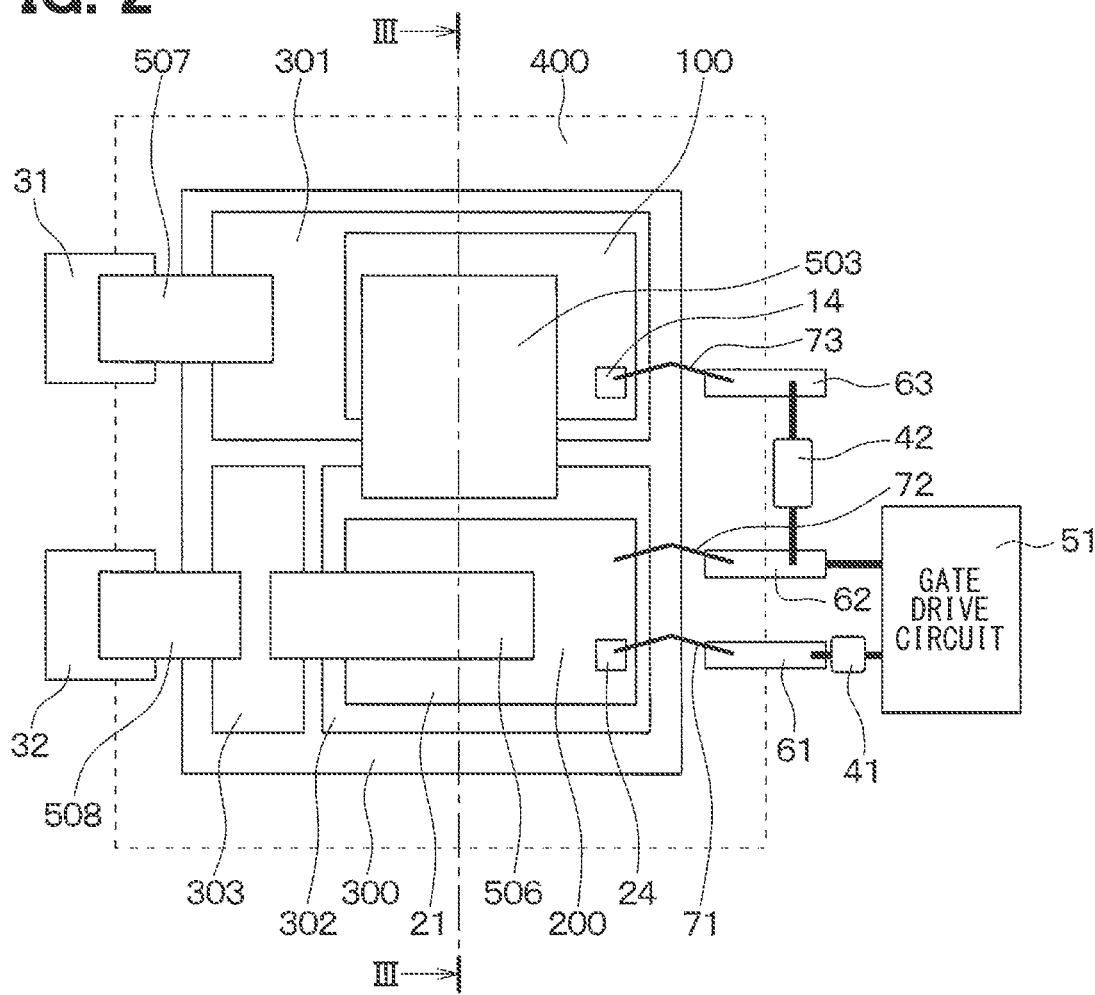
FIG. 2 is a schematic plan view of a semiconductor device.

The semiconductor device includes a first semiconductor chip 100, a second semiconductor chip 200, a substrate 300, a first terminal 31, a second terminal 32, first to third control terminals 61 to 63, a JFET adjustment resistor 42, and the like. And these are sealed with the mold resin 400 suitably. Although specifically described later, the JFET adjustment resistor 42 is disposed outside the mold resin 400. In the present embodiment, as described above, the JFET 10 is formed on the first semiconductor chip 100, and the MOSFET 20 is formed on the second semiconductor chip 200. FIG. 2 is a plan view of the semiconductor device. In order to facilitate understanding of the configuration in the mold resin 400, the configuration in the mold resin 400 is indicated by a solid line, and the mold resin 400 is indicated by a broken line.

In this embodiment, the substrate 300 is made of a DCB (i.e., Direct Copper Bond) substrate in which wiring patterns 301 to 303 made of Cu (copper) are formed on an alumina ceramic substrate by a DCB method. In the present embodiment, a first wiring pattern 301, a second wiring pattern 302, and a third wiring pattern 303 are formed on one surface 300a of the substrate 300. The first semiconductor chip 100 is disposed on the first wiring pattern 301, and the second semiconductor chip 200 is disposed on the second wiring pattern 302.

Here, the configuration of the first semiconductor chip 100 and the second semiconductor chip 200 of the present embodiment will be described. First, the configuration of the first semiconductor chip 100 will be described with reference to FIGS. 4 and 5.

Figure 4:
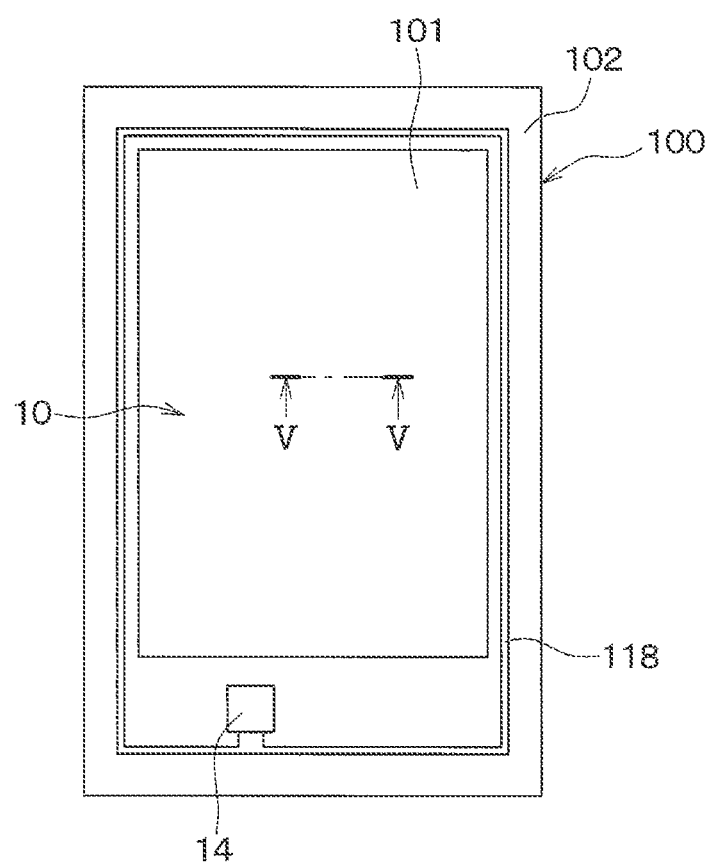
FIG. 4 is a plan view of a first semiconductor chip.

As shown in FIG. 4, the first semiconductor chip 100 has a planar rectangular shape, and has a cell region 101 and an outer peripheral region 102 surrounding the cell region 101. A JFET 10 is formed in the cell region 101.

Specifically, as shown in FIG. 5, the first semiconductor chip 100 includes a semiconductor substrate 110 having a drain layer 111 made of an N++ type silicon carbide (hereinafter referred to as SiC) substrate. Then, an N+ type buffer layer 112 having an impurity concentration lower than that of the drain layer 111 is disposed on the drain layer 111, and an N− type drift layer 113 having an impurity concentration lower than that of the buffer layer 112 is disposed on the buffer layer 112. The buffer layer 112 is provided to suppress a voltage oscillation at the time of switching of the first semiconductor chip 100. Alternatively, the buffer layer 112 may not be provided. The buffer layer 112 and the drift layer 113 are formed, for example, by growing an epitaxial film made of SiC on the SiC substrate constituting the drain layer 111.

An N− type channel layer 114 having an impurity concentration equal to that of the drift layer 113 is disposed on the drift layer 113, and an N+ type source layer 115 having an impurity concentration higher than that of the channel layer 114 is disposed in a surface portion of the channel layer 114. The channel layer 114 is formed, for example, by growing an epitaxial film made of SiC, and the source layer 115 is formed, for example, by ion-implanting an N type impurity and performing heat treatment.

Further, a P+ type gate layer (that is, a gate electrode) 13 and a P+ type body layer 116 having an impurity concentration higher than that of the channel layer 114 are formed so as to penetrate the source layer 115. The gate layer 13 and the body layer 116 are formed, for example, by forming a trench so as to penetrate the source layer 115 and growing an epitaxial film made of SiC so as to be embedded in the trench.

In the present embodiment, the gate layers 13 and the body layers 116 extend in one direction along the surface direction of the semiconductor substrate 110, and are alternately arranged in another direction along the surface direction orthogonal to the extending direction. That is, in FIG. 5, the gate layer 13 and the body layer 116 extend in the direction perpendicular to the sheet of the drawing. The gate layers 13 and the body layers 116 are alternately arranged in the left-right direction on the sheet of the drawing.

In the present embodiment, the gate layer 13 and the body layer 116 have the same impurity concentration and the same width along the arrangement direction. The body layer 116 is formed to a deeper position than the gate layer 13. In other words, the body layer 116 protrudes toward the drain layer 111 side more than the gate layer 13.

An interlayer insulation film 117 is formed on the one surface 110a of the semiconductor substrate 110. In the interlayer insulation film 117, a contact hole 117a exposing the source layer 115 and the body layer 116 is formed. A source electrode 11 electrically connected to the source layer 115 and the body layer 116 through the contact hole 117a is formed on the interlayer insulation film 117.

The source electrode 11 is formed so as to cover the entire surface of the cell region 101. That is, the source electrode 11 is formed in a so-called solid shape. Therefore, it is said that the source electrode 11 has a sufficiently large cross-sectional area as compared with a gate wiring 118 described later. In other words, it is said that the source electrode 11 has a sufficiently larger current capacity than a gate wiring 118 described later.

A drain electrode 12 that is electrically connected to the drain layer 111 is formed on the other surface 110b side of the semiconductor substrate 110.

Further, as shown in FIG. 4, the gate pad 14 and the gate wiring 118 are formed in the outer peripheral region 102. The gate wiring 118 is connected to the gate pad 14 and is electrically connected to the gate layer 13 in a different cross section from FIG. 5. Although not particularly illustrated, in the outer peripheral region 102, an annular P type well region or a plurality of P type guard rings are formed in the surface portion of the semiconductor substrate 110 so as to have a multiple ring structure surrounding the cell region 101 so that the breakdown voltage is improved.

The above description is the configuration of the first semiconductor chip 100 in the present embodiment. In the first semiconductor chip 100 of this embodiment, the N−type, N type, N+ type, and N++ type correspond to the first conductivity type, and the P+ type corresponds to the second conductivity type. Further, in the present embodiment, as described above, the semiconductor substrate 110 is configured to include the drain layer 111, the buffer layer 112, the drift layer 113, the channel layer 114, the source layer 115, the gate layer 13, and the body layer 116. Further, in the present embodiment, as described above, the drain layer 111 is formed of a SiC substrate, and the buffer layer 112, the drift layer 113, the channel layer 114 and the like are formed by growing an epitaxial film made of SiC. Therefore, the semiconductor device of the present embodiment may be defined as a SiC semiconductor device. In the present embodiment, the P type body layer 116 is formed in the first semiconductor chip 100. For this reason, the diode 15 in FIG. 1 is a diode including the body layer 116 and the drift layer 113.

In this embodiment, the body layer 116 is thus provided. For this reason, when a surge occurs, it is difficult for a surge current to flow in the gate wiring 118 having a small cross-sectional area via the gate layer 13, and the first semiconductor chip 100 is prevented from being broken due to the gate wiring 118 being melted down.

That is, as described in FIG. 1 above, the source electrode 11 is connected to the MOSFET 20. Therefore, as shown in FIG. 5, the breakdown voltage of the MOSFET 20 is defined as Bvd, the breakdown voltage between the body layer 116 and the gate layer 13 is defined as Bvgb, the resistance of the gate wiring 118 is defined as Rj, and the current flowing through the gate wiring 118 is defined as Igate. Then, the breakdown voltage is calculated by an equation of "Bvd=Rj×Igate+Bvgb." Thus, the current is calculated by an equation of "Igate=(Bvd−Bvgb)/Rj." For example, when Bvd=40V, Bvgb=20V, and Rj is 10Ω, Igate is 2 A. That is, the current flowing through the gate wiring 118 becomes a constant current regardless of the magnitude of the surge current (for example, several hundred to several thousand amperes), and the gate layer 13 and the gate wiring 118 are protected.

On the other hand, when the body layer 116 is not provided as in the present embodiment, most of the surge current flows to the gate wiring through the gate layer, so that the gate wiring may be destroyed (that is, melt down).

That is, in the present embodiment, by providing the body layer 116, it is difficult for the surge current to flow through the gate layer 13 as compared with the case where the body layer 116 is not provided. The surge current that flows into the body layer 116 flows into the source electrode 11 through the body layer 116. However, since the source electrode 11 is formed in a solid shape and the area thereof is sufficiently larger than the gate wiring 118, the possibility that the source electrode 11 melts down is low.

Further, in the present embodiment, the body layer 116 is formed deeper than the gate layer 13. That is, the length of the body layer 116 from the surface 110a to the bottom of the semiconductor substrate 110 is longer than the length of the layer 116 from the surface 110a of the semiconductor substrate 10 to the bottom of the gate layer 13. That is, the body layer 116 protrudes from the gate layer 13 to the drain layer 111 side. For this reason, the electric field strength tends to be higher on the bottom side of the body layer 116 than on the bottom side of the gate layer 13. Therefore, when a surge occurs, breakdown is likely to occur in the region on the bottom side of the body layer 116, and the surge current easily flows into the body layer 116. For this reason, in the present embodiment, it becomes difficult for a surge current to flow into the gate layer 13 further, and the surge current flowing through the gate wiring 118 is further reduced.

Next, the configuration of the second semiconductor chip 200 will be described with reference to FIGS. 6 and 7.

Figure 6:
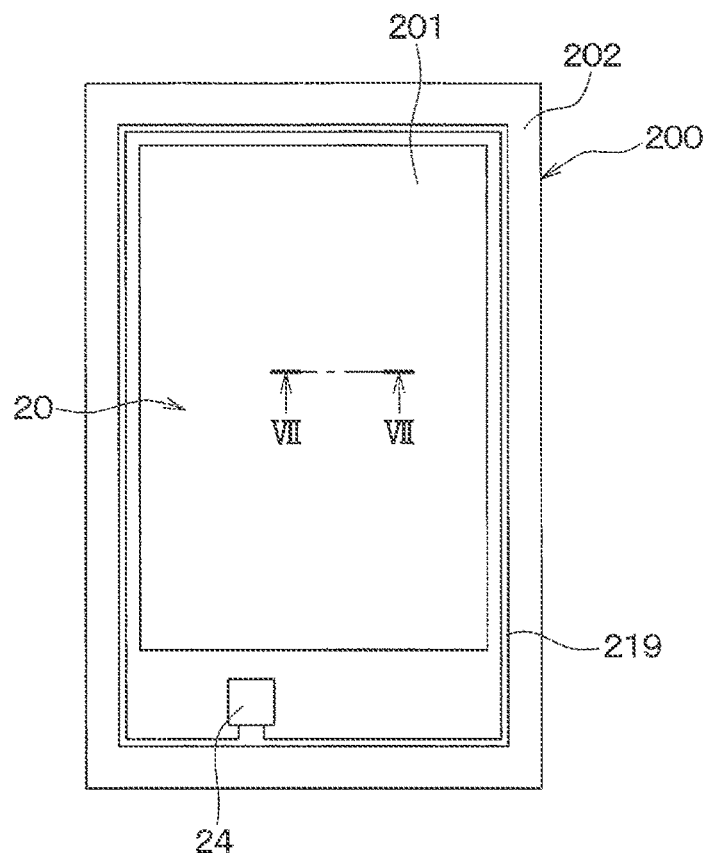
FIG. 6 is a plan view of a second semiconductor chip.

As shown in FIG. 6, the second semiconductor chip 200 has a planar rectangular shape, and has a cell region 201 and an outer peripheral region 202 surrounding the cell region 201. A MOSFET 20 is formed in the cell region 201.

Figure 7:
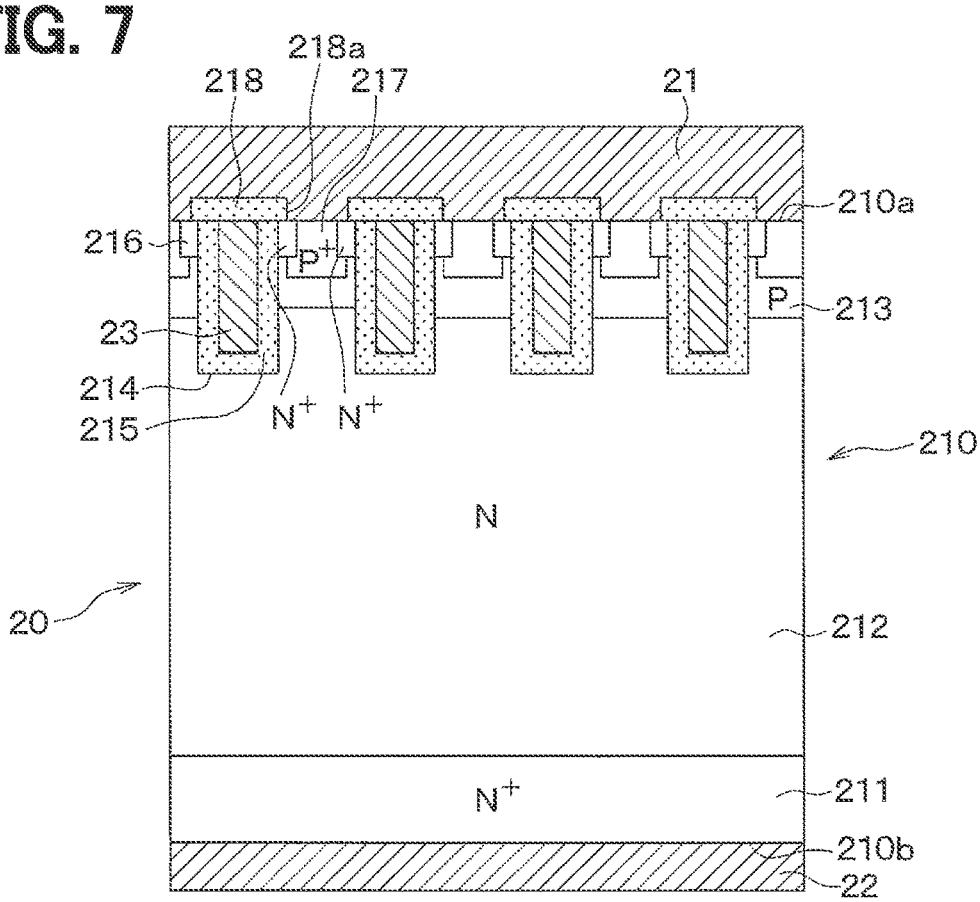
FIG. 7 is a cross-sectional view taken along a line VII-VII shown in FIG. 6.

Specifically, as shown in FIG. 7, the second semiconductor chip 200 includes a semiconductor substrate 210 having a drain layer 211 made of an N++ type silicon carbide (hereinafter referred to as SiC) substrate. An N− type drift layer 212 having a lower impurity concentration than the drain layer 211 is disposed on the drain layer 211. A P type channel layer 213 having a higher impurity concentration than the drift layer 212 is disposed on the drift layer 212.

In addition, a plurality of trenches 214 are formed in the semiconductor substrate 210 so as to penetrate the channel layer 213 and reach the drift layer 212, and the channel layer 213 is separated into a plurality of portions by the trenches 214. In the present embodiment, the trenches 214 are formed at regular intervals in a stripe manner along one direction of a surface direction of the one surface 210a of the semiconductor substrate 210 (that is, a direction perpendicular to the sheet of the drawing in FIG. 7). Note that the plurality of trenches 214 may have an annular structure by bending the tip portions thereof.

In each trench 214, a gate insulation film 215 formed to cover an inner wall surface of each trench 214, and a gate electrode 23 formed of polysilicon or the like formed on the gate insulation film 215 are embedded. These provide a trench gate structure.

In the channel layer 213, an N+ type source layer 216 and a P+ type contact layer 217 are formed so as to be sandwiched between the source layers 216. The source layer 216 is configured to have a higher impurity concentration than the drift layer 212, is terminated in the channel layer 213, and is in contact with the side wall of the trench 214. The contact layer 217 has a higher impurity concentration than the channel layer 213 and is formed so as to terminate in the channel layer 213, similarly to the source layer 216.

To be more specific, the source layer 216 is extended in a bar manner to be in contact with a side wall of the trench 214 along the longitudinal direction of the trench 214 in a region between adjacent two of the trenches 214, and terminated inside a tip of the trench 214 in its structure. Further, the contact layer 217 is sandwiched between two source layers 216 and extends in a rod shape along the longitudinal direction of the trench 214 (that is, the source layer 216). Note that the contact layer 217 of this embodiment is formed deeper than the source layer 216 with respect to the one surface 210a of the semiconductor substrate 210.

An interlayer insulation film 218 is formed on the channel layer 213 (that is, one surface 210a of the semiconductor substrate 210). In the interlayer insulation film 218, a contact hole 218a exposing a part of the source layer 216 and the contact layer 217 is formed. On the interlayer insulation film 218, the source electrode 21 electrically connected to the source layer 216 and the contact layer 217 through the contact hole 218a is formed.

A drain electrode 22 that is electrically connected to the drain layer 211 is formed on the other surface 210b side of the semiconductor substrate 210.

Further, as shown in FIG. 6, the gate pad 24 and the gate wiring 219 are formed in the outer peripheral region 202. The gate wiring 219 is electrically connected to the gate electrode 23 in a cross section different from that in FIG. 7. Although not particularly illustrated, in the outer peripheral region 202, an annular P type well region or a plurality of P type guard rings are formed in the surface portion of the semiconductor substrate 210 so as to have a multiple ring structure surrounding the cell region 201 so that the breakdown voltage is improved.

The above description is the configuration of the second semiconductor chip 200. In the present embodiment, as described above, the semiconductor substrate 210 includes the drain layer 211, the drift layer 212, the channel layer 213, the source layer 216, and the contact layer 217.

Figure 3:
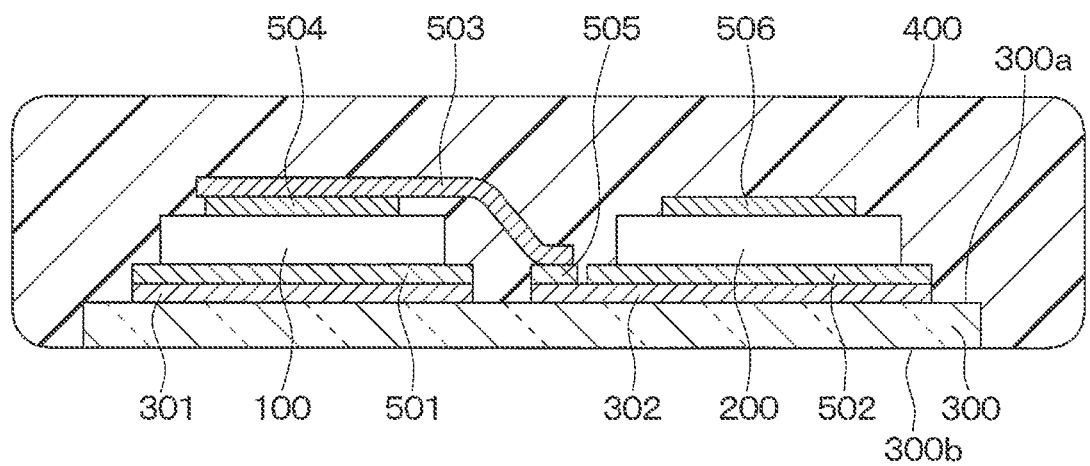
FIG. 3 is a cross-sectional view taken along a line III-III shown in FIG. 2.

As shown in FIGS. 2 and 3, the first semiconductor chip 100 is mounted on the one surface 300a of the substrate 300 so that the drain electrode 12 is connected to the first wiring pattern 301 via the bonding member 501. That is, the first semiconductor chip 100 is mounted such that the gate pad 14 and the source electrode 11 (not shown) are opposite to the first wiring pattern 301 side. The second semiconductor chip 200 is mounted on the one surface 300a of the substrate 300 so that the drain electrode 22 is connected to the second wiring pattern 302 via the bonding member 502. That is, the second semiconductor chip 200 is mounted such that the gate pad 24 and the source electrode 21 (not shown) are opposite to the second wiring pattern 302 side. The first semiconductor chip 100 and the second semiconductor chip 200 are also thermally connected to the substrate 300.

Further, the source electrode 11 of the first semiconductor chip 100 and the drain electrode 22 of the second semiconductor chip 200 are electrically connected to each other via a connection member 503. In the present embodiment, the connection member 503 is made of a Cu ribbon or the like having a longitudinal direction, one end thereof is connected to the source electrode 11 via the bonding member 504, and the other end thereof is connected to the second wiring pattern 302 (that is, the drain electrode 22) via the bonding member 505. In the present embodiment, for example, solder is used for each of the bonding members 501, 502, 504, and 505.

The source electrode 21 of the second semiconductor chip 200 is connected to the third wiring pattern 303 via the connection member 506. The first wiring pattern 301 is connected to the first terminal 31 via the connection member 507. The third wiring pattern 303 is connected to the second terminal 32 via the connection member 508.

The first terminal 31 and the second terminal 32 each have a flat plate shape, and one end portion side is disposed on the substrate 300 side and the other end portion side is disposed on the opposite side to the substrate 300. One end of the first terminal 31 is connected to the connection member 507, and one end of the second terminal 32 is connected to the connection member 508. The connection members 506 to 508 are made of, for example, a Cu ribbon, and are connected to each other via solder or the like. Further, the third wiring pattern 303 functions for mounting the connection member 507 and the connection member 508 on the same plane. For this reason, the third wiring pattern 303 and the connection member 508 may not be provided, and the source electrode 21 and the second terminal 32 of the second semiconductor chip 200 may be directly connected to each other via the connection member 506.

The first to third control terminals 61 to 63 each have a flat plate shape, and one end side is arranged on the substrate 300 side and the other end side is arranged on the opposite side to the substrate 300. One end of the first control terminal 61 is electrically connected to the gate pad 24 of the second semiconductor chip 200 via the bonding wire 71, and the other end is connected to the gate drive circuit 51 via the MOSFET adjustment resistor 41.

One end of the second control terminal 62 is electrically connected to the source electrode 21 of the second semiconductor chip 200 via the bonding wire 72, and the other end is connected to the gate drive circuit 51.

One end of the third control terminal 63 is electrically connected to the gate pad 14 of the first semiconductor chip 100 via a bonding wire 73. The third control terminal 63 is connected to the other end of the second control terminal 62 via the JFET adjustment resistor 42 on the other end side. As a result, as shown in FIG. 1, the source electrode 21 of the MOSFET 20 and the gate layer 13 of the JFET 10 are connected to each other via the JFET adjustment resistor 42. The JFET adjustment resistor 42 is an external component configured as a separate component from the first semiconductor chip 100 and the second semiconductor chip 200 as described above.

The first semiconductor chip 100, the second semiconductor chip 200, the substrate 300, the first terminal 31, the second terminal 32, the first to third control terminals 61 to 63, and the like are sealed and integrated with a mold resin 400. Specifically, these are sealed by the mold resin 400 such that the other surface 300*b* opposite to the one surface 300*a* of the substrate 300, the first terminal 31, the second terminal 32, and the first to third control terminals 61 to 63 on the other end side are exposed. Accordingly, in the present embodiment, heat generated in the first and second semiconductor chips 100 and 200 is discharged from a portion of the substrate 300 exposed from the mold resin 400. That is, the semiconductor device of this embodiment has a so-called single-sided heat radiation structure. The JFET adjustment resistor 42 is provided in a portion of the second control terminal 62 and the third control terminal 63 exposed from the mold resin 400. That is, the JFET adjustment resistor 42 is provided in a state where it is easily attached and detached and exchangeable.

As described above, in the present embodiment, the JFET adjustment resistor 42 is disposed so as to be exposed from the mold resin 400. For this reason, the JFET adjustment resistor 42 whose resistance value is adjusted can be easily attached and detached and replaceable according to the application. Therefore, a highly versatile semiconductor device can be obtained.

Further, the JFET adjustment resistor 42 includes a first resistance circuit 421 and a second resistance circuit 422. For this reason, when the semiconductor device switches on and switches off, the semiconductor device is adjusted to have a desired switching speed for each case. Therefore, a highly reliable semiconductor device can be obtained.

In the JFET adjustment resistor 42, the second resistor 422*b* has a smaller value than the first resistor 421*b*. For this reason, for example, compared with the case where the second resistor 422*b* has a larger value than the first resistor 421*b*, the switching speed at the time of switching off operation is made quicker. Then, the switching off operation of the JFET 10 quickly follows the switching off operation of the MOSFET 20. Therefore, even when the MOSFET 20 switches off, the JFET 10 does not switch off, so that it is possible to suppress the occurrence of an overvoltage being applied to the MOSFET 20. Thereby, avalanche breakdown is suppressed from being generated in MOSFET 20, and the reliability of a semiconductor device is improved.

Second Embodiment

A second embodiment will be described. The present embodiment is different from the first embodiment in that the first semiconductor chip 100 is provided with a temperature sense and the second semiconductor chip 200 is provided with a current sense. Since other features are same, the description thereof is skipped.

Figure 8:
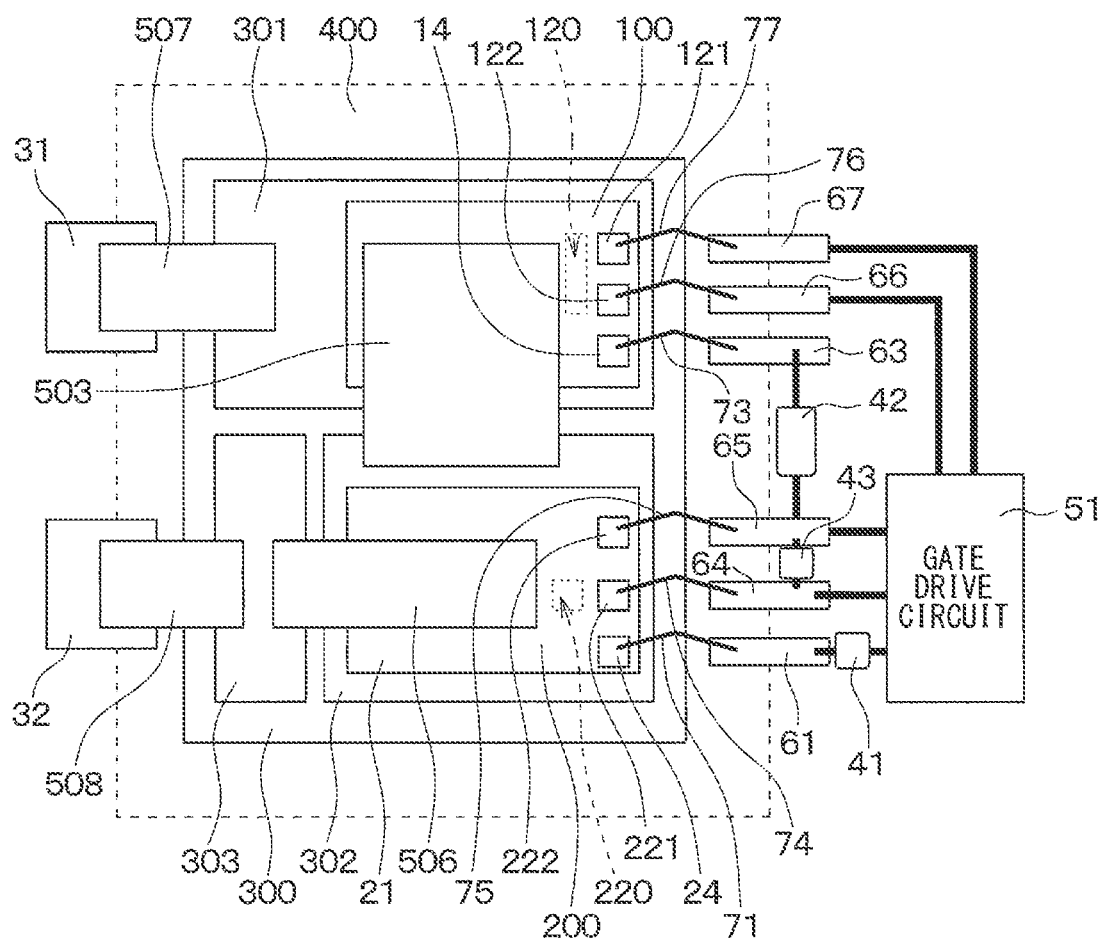
FIG. 8 is a schematic plan view of a semiconductor device according to a second embodiment.
Figure 9:
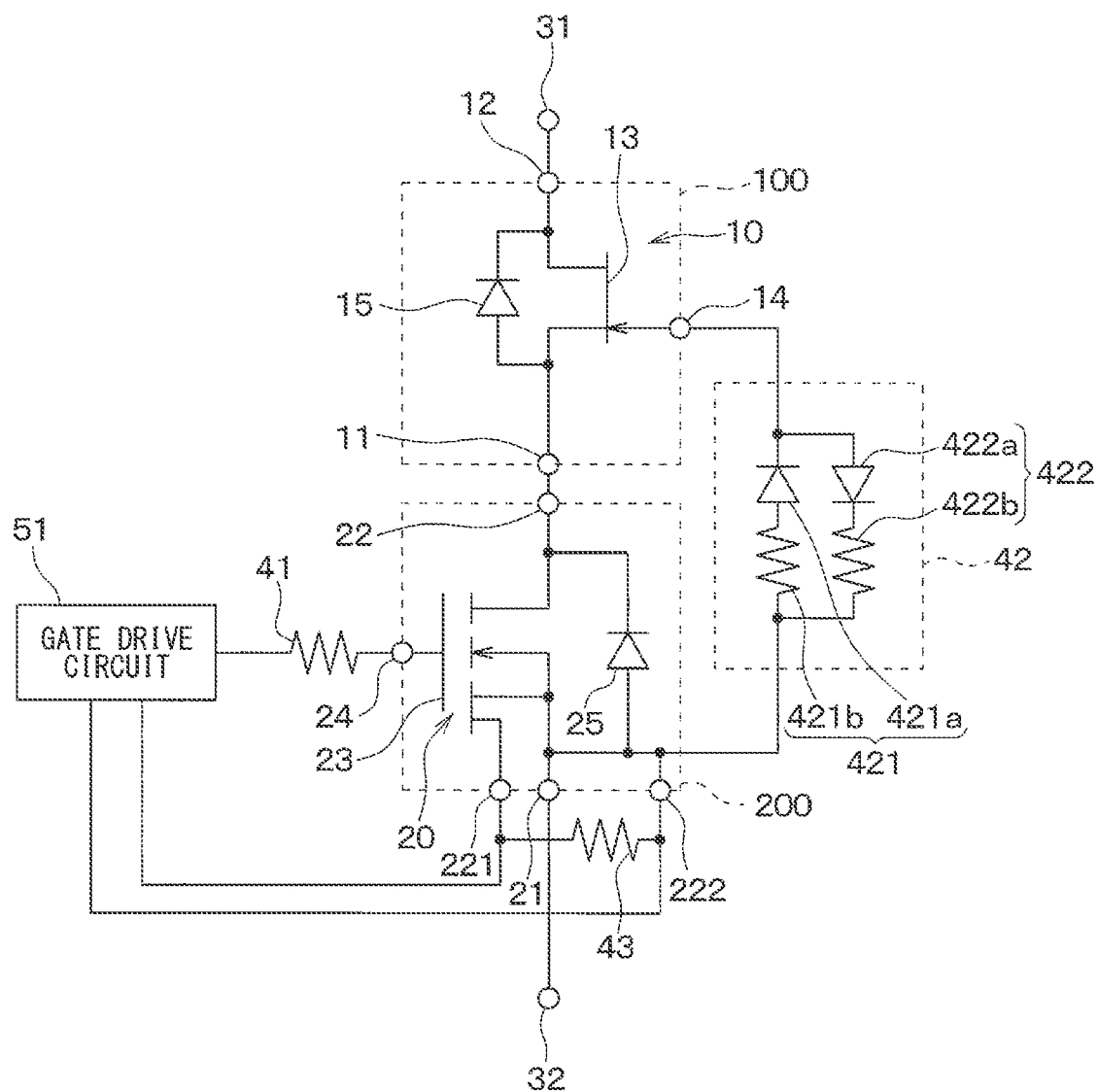
FIG. 9 is a circuit diagram of a semiconductor device according to a second embodiment.

In the present embodiment, as shown in FIGS. 8 and 9, the first semiconductor chip 100 is formed with a temperature sense 120 for detecting the temperature of the first semiconductor chip 100, and with temperature sense pads 121 and 122 electrically connected to the temperature sense 120. FIG. 8 is a plan view of the semiconductor device. In order to facilitate understanding of the configuration in the mold resin 400, the configuration in the mold resin 400 is indicated by a solid line, and the mold resin 400 is indicated by a broken line.

In the second semiconductor chip 200, a current sense 220 for detecting a current flowing through the second semiconductor chip 200 is formed, and a current sense pad 221 electrically connected to the current sense 220 is formed. Further, a Kelvin source pad 222 that is electrically connected to the source layer 115 of the MOSFET 20 and has the same potential as the source layer 115 is formed on the second semiconductor chip 200.

In the present embodiment, in the first semiconductor chip 100 and the second semiconductor chip 200, a on-state resistance in the first semiconductor chip 100 is higher than that in the second semiconductor chip 200. That is, the on-state resistance of the JFET 10 is higher than that of the MOSFET 20.

In addition to the first and third control terminals 61 and 63, fourth to seventh control terminals 64 to 67 are disposed around the substrate 300. The fourth to seventh control terminals 64 to 67 are formed in a flat plate shape, similar to the first and third control terminals 61 and 63, and one end side is disposed on the substrate 300 side, and the other end side is disposed on the opposite side of the substrate 300.

The fourth control terminal 64 has one end portion electrically connected to the current sense pad 221 of the second semiconductor chip 200 via the bonding wire 74 and the other end portion electrically connected to the gate drive circuit 51. As a result, the detection result detected by the current sense 220 is input to the gate drive circuit 51.

One end portion of the fifth control terminal 65 is electrically connected to the Kelvin source pad 222 of the second semiconductor chip 200 via the bonding wire 75, and the other end portion is connected to the gate drive circuit 51. The fifth control terminal 65 is connected to the other end portion of the third control terminal 63 via the JFET adjustment resistor 42 on the other end side. Further, the fifth control terminal 65 is connected to the fourth control terminal 64 via the resistor 43 on the other end side.

The sixth and seventh control terminals 66 and 67 are electrically connected at one end side to the temperature sense pads 121 and 122 of the first semiconductor chip 100 via bonding wires 76 and 77, respectively. Further, the sixth and seventh control terminals 66 and 67 are electrically connected to the gate drive circuit 51 on the other end side. As a result, the detection result detected by the temperature sense 120 is input to the gate drive circuit 51.

The gate drive circuit 51 compares the detection result of the current sense 220 and the detection result of the temperature sense 120 with threshold values. When each detection result is less than the threshold value, the gate voltage applied based on the input signal from the external circuit is adjusted. That is, the gate drive circuit 51 determines whether an amount of current flowing through the semiconductor device is appropriate and the temperature of the first semiconductor chip 100 is appropriate when the semiconductor device switches on based on an input signal from an external circuit, or when the semiconductor device 100 maintains the on state. When the gate drive circuit 51 determines that the amount of current flowing through the semiconductor device is appropriate and the temperature of the first semiconductor chip 100 is appropriate, the gate drive circuit 51 applies a predetermined positive gate voltage. On the other hand, when the gate drive circuit 51 determines that the detection result of the current sense 220 or the detection result of the temperature sense 120 is greater than or equal to the threshold value, the gate drive circuit 51 reduces the gate voltage (for example, to be 0 V) regardless of the input signal from the external circuit, and turns off the semiconductor device. That is, when the gate drive circuit 51 determines that the current flowing through the semiconductor device is an abnormal current (that is, an overcurrent) and the first semiconductor chip 100 has an abnormal temperature, regardless of the input signal from the external circuit, the gate drive circuit 51 reduces the gate voltage and turns off the semiconductor device.

As described above, in this embodiment, the temperature sense 120 is formed in the first semiconductor chip 100, and the current sense 220 is formed in the second semiconductor chip 200. For this reason, compared with the case where the current sense 220 is formed in each of the first semiconductor chip 100 and the second semiconductor chip 200, the region in the first semiconductor chip 100 can be effectively utilized. Further, compared to the case where the temperature sense 120 is formed in each of the first semiconductor chip 100 and the second semiconductor chip 200, the region in the second semiconductor chip 200 can be effectively utilized.

A current sense 220 is disposed on the second semiconductor chip 200. In the present embodiment, the second semiconductor chip 200 is made of a Si substrate, and the manufacturing process is easier than the first semiconductor chip 100 which is made of a SiC substrate. Therefore, cost can be reduced. That is, by providing the second semiconductor chip 200 with the current sense 220, the cost of the entire semiconductor device can be reduced.

Further, the temperature sense 120 is arranged on the first semiconductor chip 100 having a high on-state resistance. That is, the temperature (that is, the amount of generated heat) depends on the on-state resistance, and increases as the on-state resistance increases. Therefore, the temperature sense 120 is formed in the first semiconductor chip 100 where the temperature tends to increase. Therefore, the first semiconductor chip 100 can be prevented from being destroyed by adjusting the gate voltage based on the temperature of the first semiconductor chip 100 having a comparatively high temperature. That is, the semiconductor device can be prevented from being destroyed.

Third Embodiment

A third embodiment will be described. In the present embodiment, the temperature sense 120 is formed on the second semiconductor chip 200 compared with the second embodiment, and the other features are the same as those in the second embodiment, and thus the description thereof is omitted here.

Figure 10:
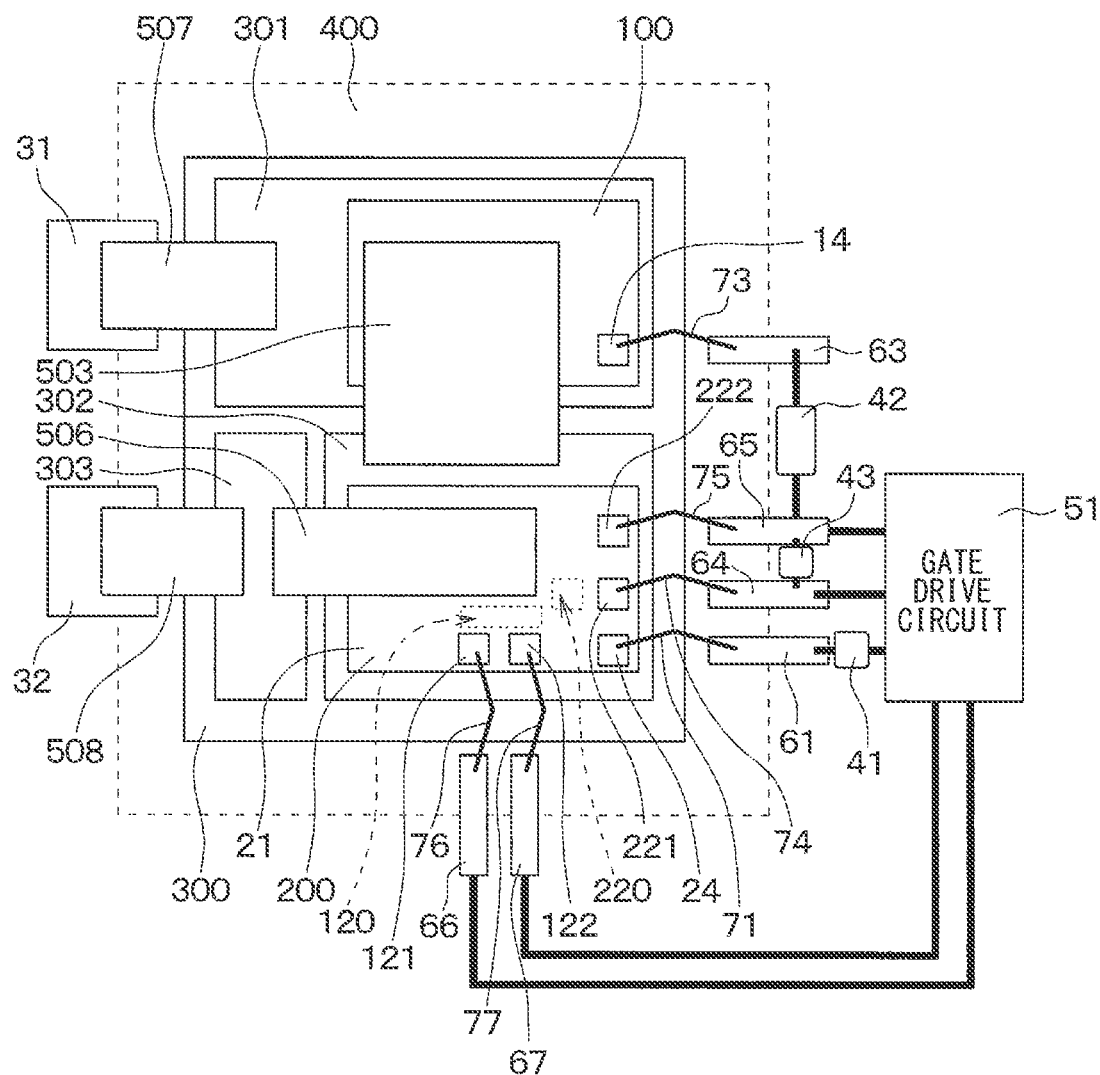
FIG. 10 is a schematic plan view of a semiconductor device according to a third embodiment.

In the present embodiment, as shown in FIG. 10, the temperature sense 120 is formed in the second semiconductor chip 200. In addition to the temperature sense 120, temperature sense pads 121 and 122 are also disposed on the second semiconductor chip 200. That is, in the present embodiment, the temperature of the second semiconductor chip 200 is detected by the temperature sense 120. FIG. 10 is a plan view of the semiconductor device. In order to facilitate understanding of the configuration in the mold resin 400, the configuration in the mold resin 400 is indicated by a solid line, and the mold resin 400 is indicated by a broken line.

Figure 11:
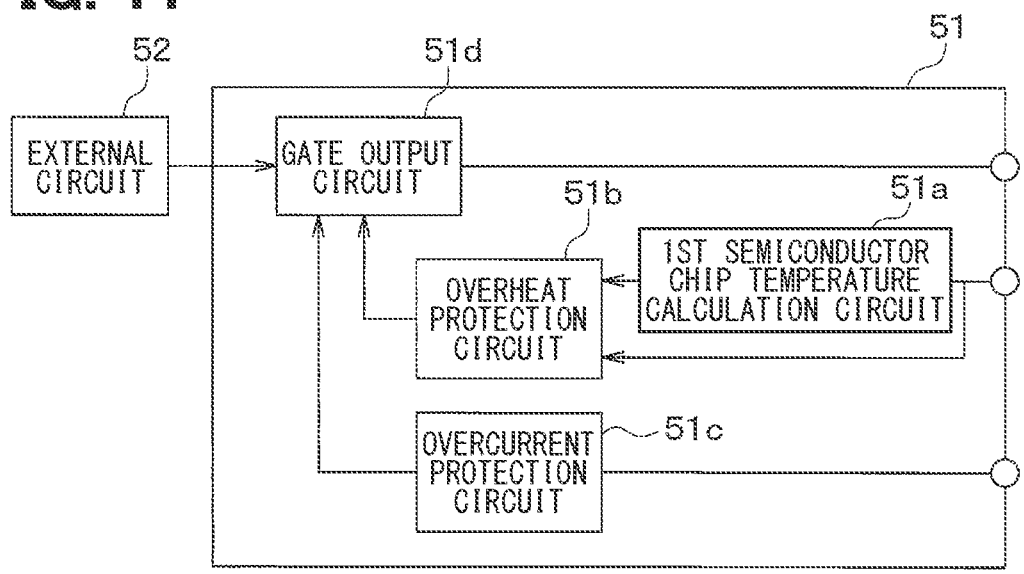
FIG. 11 is a block diagram showing a circuit configuration of a gate drive circuit.

Next, the gate drive circuit 51 of the present embodiment will be described with reference to FIG. 11. As shown in FIG. 11, the gate drive circuit 51 of this embodiment includes a first semiconductor chip temperature calculation circuit (hereinafter simply referred to as a temperature calculation circuit) 51a, an overheat protection circuit 51b, an overcurrent protection circuit 51c, and a gate output circuit 51d and the like.

The temperature calculation circuit 51a includes a storage unit and a calculation unit (not shown). When a detection signal from the temperature sense 120 formed on the second semiconductor chip 200 is input, the temperature of the first semiconductor chip 100 is calculated based on the temperature of the second semiconductor chip 200. For the storage unit, for example, a non-transitory tangible storage medium such as a memory is used.

Figure 12:
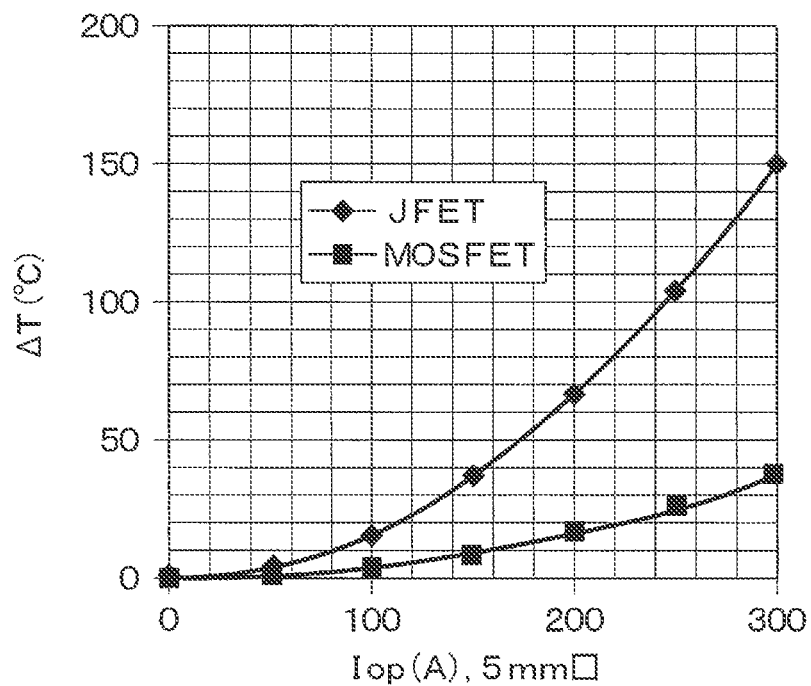
FIG. 12 is a diagram illustrating a simulation result regarding a relationship between a current flowing through a semiconductor device and a temperature change.
Figure 13:
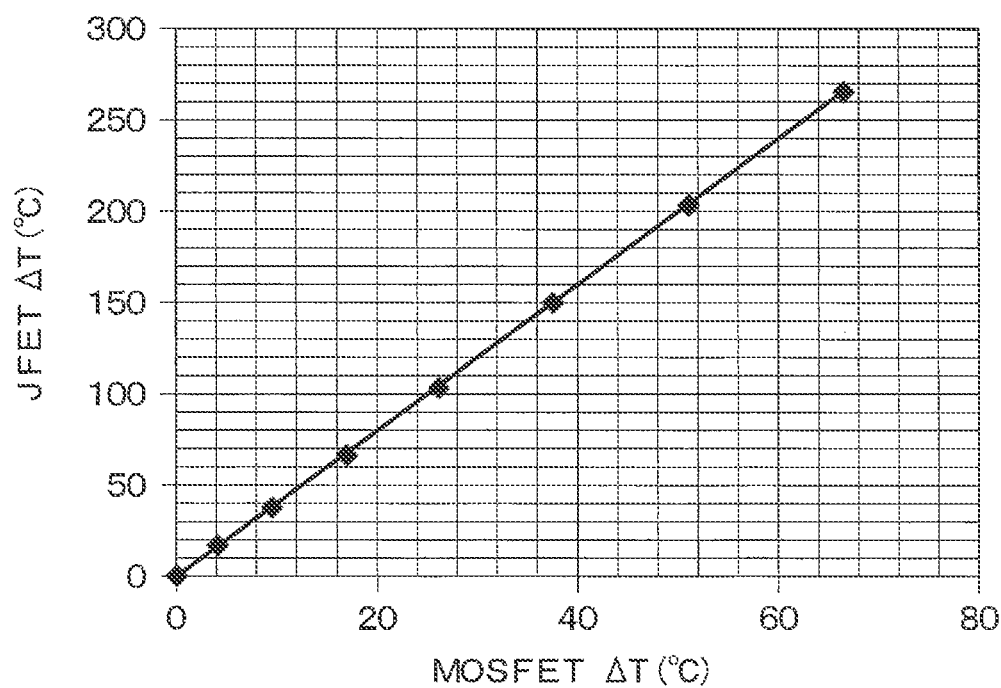
FIG. 13 is a diagram showing a relationship between a temperature change of a MOSFET and a temperature change of a JFET.

Specifically, as shown in FIG. 12, the temperature change $\Delta T$ differs between the JFET 10 (i.e., the first semiconductor chip 100) and the MOSFET 20 (i.e., the second semiconductor chip 200) depending on the flowing current. As shown in FIG. 13, the relationship between the temperature change $\Delta T$ of the MOSFET 20 and the temperature change $\Delta T$ of the JFET 10 can be derived from the relationship shown in FIG. 12. Therefore, a relationship between the temperature change $\Delta T$ of the MOSFET 20 and the temperature change $\Delta T$ of the JFET 10 is stored in advance in the storage unit. For example, regarding the relationship between the temperature change $\Delta T$ of the MOSFET 20 and the temperature change $\Delta T$ of the JFET 10 shown in FIG. 13, four times the temperature change $\Delta T$ of the MOSFET 20 is equal to the temperature change $\Delta T$ of the JFET 10.

Therefore, when the detection signal from the temperature sense 120 is input, the temperature calculation circuit 51a calculates the temperature change $\Delta T$ of the MOSFET 20 from the detection signal. The temperature calculation circuit 51a calculates the temperature change $\Delta T$ of the JFET 10 from the temperature change $\Delta T$ of the MOSFET 20, calculates the temperature of the JFET 10 from the temperature change $\Delta T$ thereof, and outputs the temperature to the overheat protection circuit 51b.

When the detection signal is input from the temperature sense 120 formed in the second semiconductor chip 200, the overheat protection circuit 51b determines whether the temperature of the second semiconductor chip 200 is equal to or higher than a threshold temperature. Further, when the temperature of the first semiconductor chip 100 is input from the temperature calculation circuit 51a, the overheat protection circuit 51b determines whether the temperature of the first semiconductor chip 100 is equal to or higher than a threshold value. When the overheat protection circuit 51b determines that at least one of the temperatures is equal to or higher than the threshold value, the overheat protection circuit 51b outputs a signal indicating an abnormal temperature to the gate output circuit 51d.

When a detection signal is input from the current sense 220 formed in the second semiconductor chip 200, the overcurrent protection circuit 51c determines whether a current that flows through the second semiconductor chip 200 (that is, a current that flows through the semiconductor device) is equal to or greater than a threshold current. When the overcurrent protection circuit 51c determines that the current flowing through the second semiconductor chip 200 is greater than or equal to the threshold, the overcurrent protection circuit 51c outputs a signal, indicating that an abnormal current is flowing, to the gate output circuit 51d.

The gate output circuit 51d controls the gate voltage applied to the gate electrode 23 of the MOSFET 20 based on an input signal from the external circuit 52 or the like. At this time, when a signal indicating an abnormal temperature is received from the overheat protection circuit 51*b* or a signal indicating an abnormal current is received from the overcurrent protection circuit 51*c*, regardless of the input signal from the external circuit 52, the gate voltage applied to the gate electrode 23 of the MOSFET 20 is reduced (for example, to be 0 V). That is, in this embodiment, the gate voltage is controlled in consideration of the temperature of the first semiconductor chip 100 where the temperature sense 120 is not formed. Thereby, the semiconductor device can be prevented from being destroyed similar to the second embodiment.

As described above, in this embodiment, the temperature sense 120 is formed on the second semiconductor chip 200. For this reason, as described above, the second semiconductor chip 200 is configured to made of the Si substrate, and the manufacturing process is easier than the first semiconductor chip 100 configured to made of the SiC substrate. Therefore, cost can be reduced.

Fourth Embodiment

A fourth embodiment will be described. In the present embodiment, the source electrode 11 of the first semiconductor chip 100 and the second wiring pattern 302 are connected to each other by a bonding wire as compared with the first embodiment. Further, in the present embodiment, the source electrode 21 of the second semiconductor chip 200 and the third wiring pattern 303 are connected to each other by a bonding wire as compared with the first embodiment. The remaining configuration is similar to that according to the first embodiment and will thus not be described repeatedly.

Figure 14:
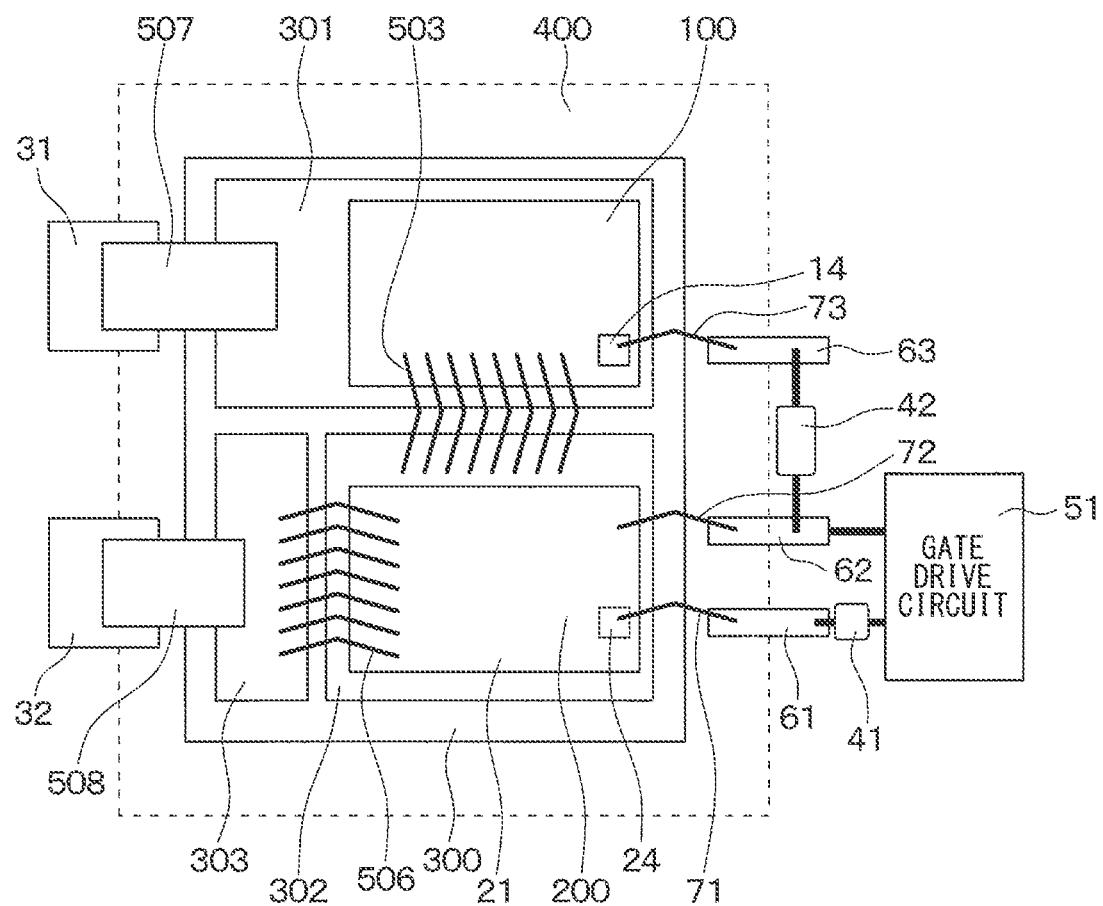
FIG. 14 is a schematic plan view of a semiconductor device according to a fourth embodiment.

In the present embodiment, as shown in FIG. 14, the first semiconductor chip 100 and the second wiring pattern 302 are connected by a plurality of bonding wires as the connection members 503. Further, the second semiconductor chip 200 and the third wiring pattern 303 are connected by a plurality of bonding wires as the connection member 506. FIG. 14 is a plan view of the semiconductor device. In order to facilitate understanding of the configuration in the mold resin 400, the configuration in the mold resin 400 is indicated by a solid line, and the mold resin 400 is indicated by a broken line.

As described above, the connection members 503 and 506 may be formed of bonding wires. In addition, when forming the connection members 503 and 506 with bonding wires, the inductance is changed by changing the number of bonding wires, and the switching speed is also changed. For this reason, in this embodiment, the switching speed can be easily changed by adjusting the number of bonding wires.

Fifth Embodiment

A fifth embodiment will be described. This embodiment is different from the first embodiment in that it includes a plurality of first semiconductor chips 100 and a plurality of second semiconductor chips 200, and the other features are the same as the first embodiment. Thus, the other features are not described repeatedly.

Figure 15:
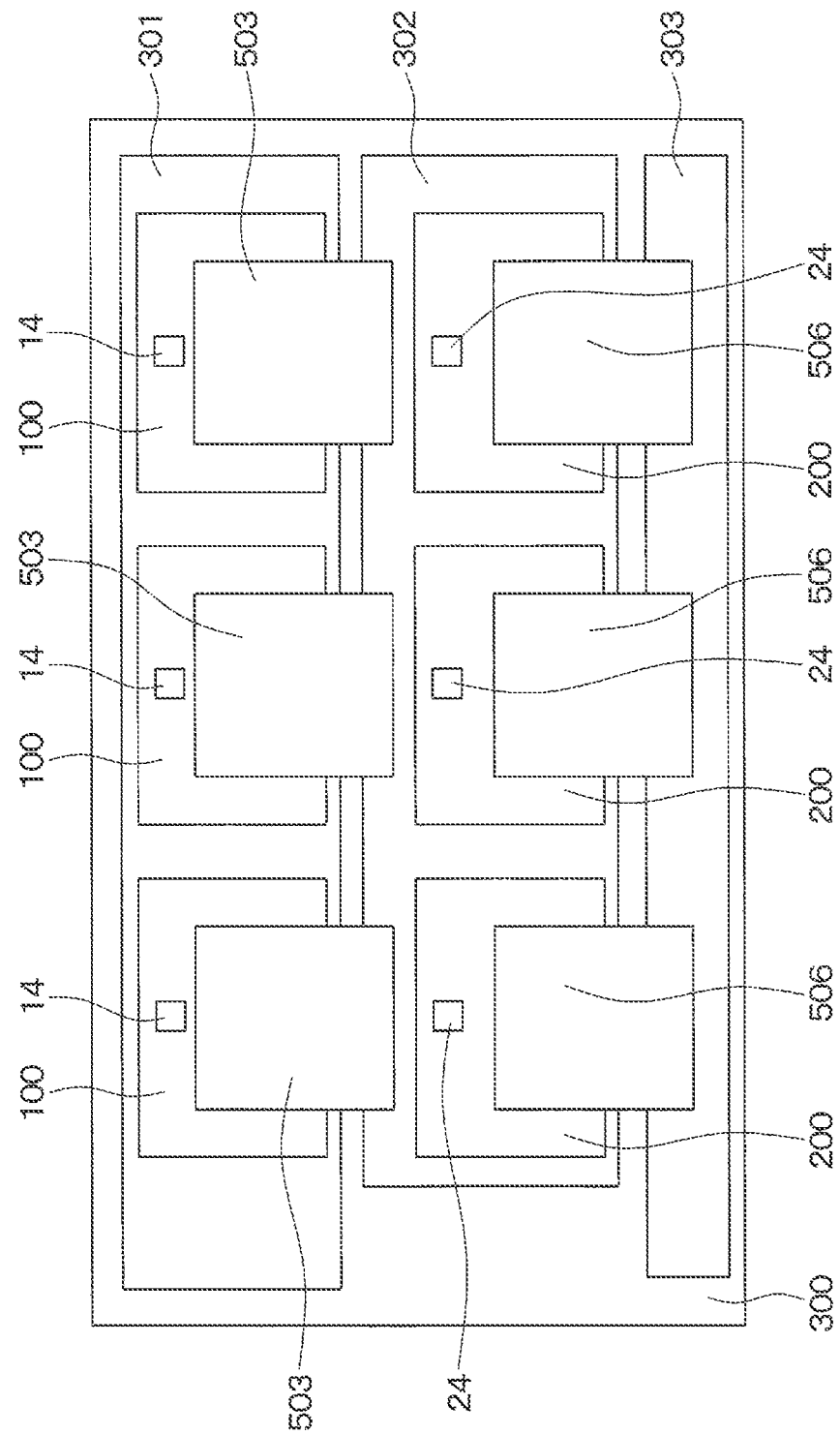
FIG. 15 is a schematic plan view of a semiconductor device according to a fifth embodiment.

In the present embodiment, as shown in FIG. 15, three first semiconductor chips 100 are mounted on the first wiring pattern 301. In each first semiconductor chip 100, the drain electrode 12 is electrically connected to the first wiring pattern 301. In addition, three second semiconductor chips 200 are mounted on the second wiring pattern 302. In each second semiconductor chip 200, the drain electrode 22 is electrically connected to the second wiring pattern 302.

In addition, the source electrode 11 of each first semiconductor chip 100 is electrically connected to the second wiring pattern 302 via the connection member 503. In each second semiconductor chip 200, the source electrode 21 is electrically connected to the third wiring pattern 303 via a connection member 506. That is, each first semiconductor chip 100 and second semiconductor chip 200 are connected in parallel, respectively.

In FIG. 15, the drain electrode 22, the first terminal 31, the second terminal 32, the JFET adjustment resistor 42, the first to third control terminals 61 to 63, the mold resin 400, and the like are not shown.

Thus, in a semiconductor device, a plurality of first semiconductor chips 100 and second semiconductor chips 200 may be mounted on the substrate 300. Further, by arranging the plurality of first semiconductor chips 100 and the plurality of second semiconductor chips 200 in this way, the efficiency of good wafers can be increased, compared with the case where one first semiconductor chip 100 and one second semiconductor chip 200 having the same size are arranged.

Figure 16:
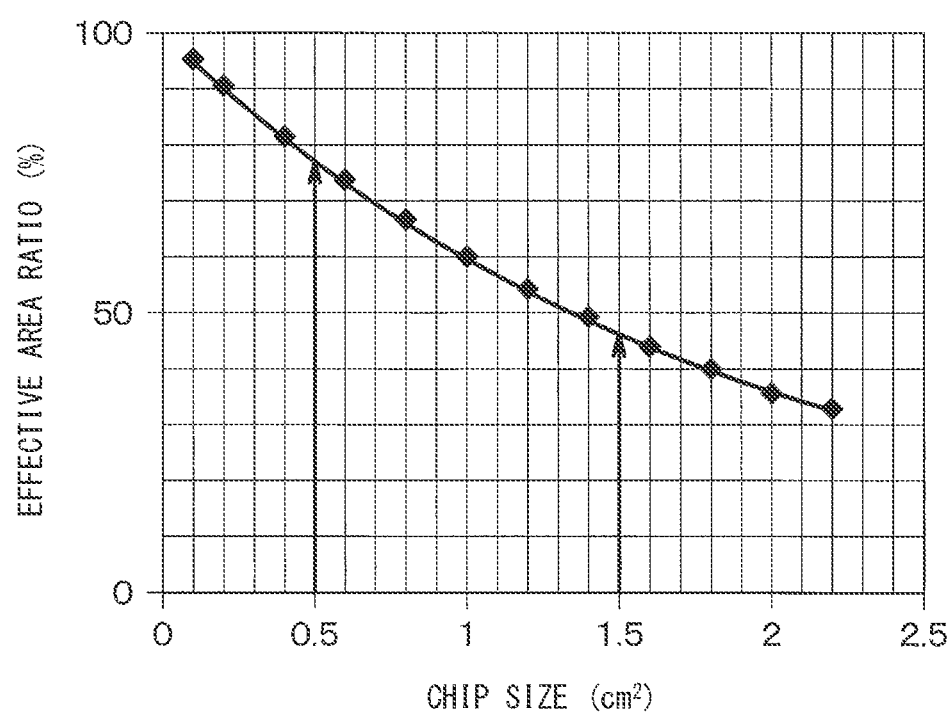
FIG. 16 is a diagram showing a simulation result regarding the relationship between a chip size and an effective area ratio.

That is, each of the first semiconductor chips 100 and the second semiconductor chips 200 is usually configured by divided the wafer into chips after a predetermined manufacturing process is performed on the wafer. Therefore, for example, as shown in FIG. 16, when the effective area ratio (i.e., a yield) of a semiconductor chip of 0.1 cm2 is 95%, and three semiconductor chips having a area of 0.5 cm2 are used, the effective area ratio can be increased about twice as compared with the case of using one semiconductor chip having an area of 1.5 cm2. That is, according to the present embodiment, it is possible to reduce the cost by increasing the non-defective product efficiency of the wafer.

Sixth Embodiment

A sixth embodiment will be described hereafter. The sixth embodiment is a combination of the second embodiment and the fifth embodiment, and the other features are the same as those of the fifth embodiment, and thus description thereof is omitted here.

Figure 17:
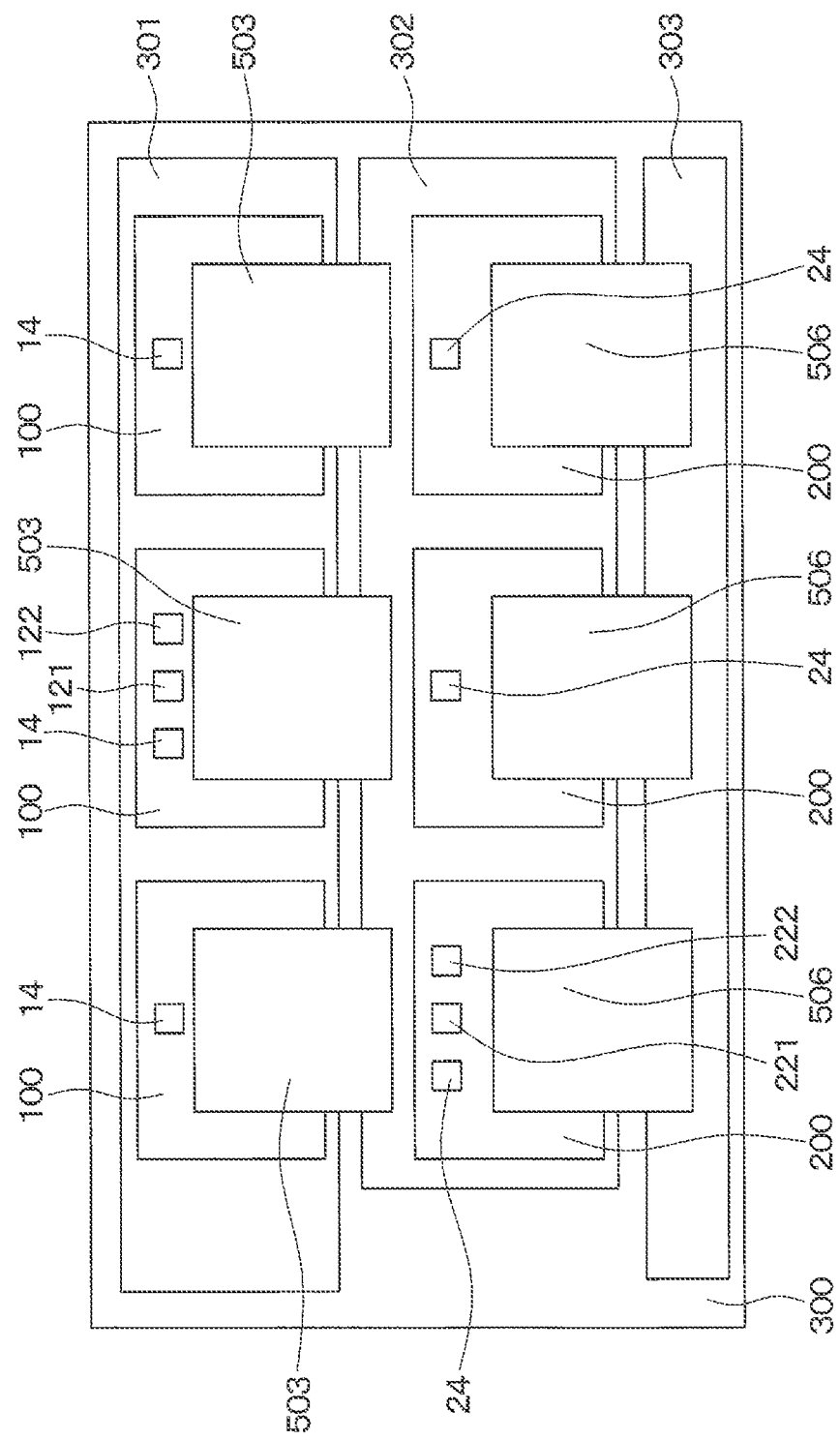
FIG. 17 is a schematic plan view of a semiconductor device according to a sixth embodiment.

In the present embodiment, as shown in FIG. 17, three first semiconductor chips 100 are arranged along one direction in the surface direction of the substrate 300 (that is, the left-right direction on the sheet of the drawing in FIG. 17). Temperature sense pads 121 and 122 are formed on the first semiconductor chip 100 located in the center along the arrangement direction of the three first semiconductor chips 100. Although not shown, the temperature sense 120 is also formed on the first semiconductor chip 100 on which the temperature sense pads 121 and 122 are formed. That is, in the present embodiment, among the three first semiconductor chips 100, the temperature sense 120 and the temperature sense pads 121 and 122 are formed on the first semiconductor chip 100 that tends to have the highest temperature due to the influence of heat generated by the adjacent first semiconductor chips 100.

Further, three second semiconductor chips 200 are arranged along one direction in the surface direction of the substrate 300 (that is, the right and left direction of the sheet of the drawing in FIG. 17). A current sense pad 221 and a Kelvin source pad 222 are formed on one of the three second semiconductor chips 200. Although not shown, the current sense 220 is also formed on the second semiconductor chip 200 on which the current sense pad 221 is formed. In FIG. 17, the first terminal 31, the second terminal 32, the JFET adjustment resistor 42, the first to third control terminals 61 to 63, the mold resin 400, and the like are not shown.

As described above, the second embodiment may be combined with the fifth embodiment, and the temperature sense 120 and the current sense 220 may be provided. In this embodiment, since the temperature sense 120 is formed only on one first semiconductor chip 100, the area efficiency of the remaining first semiconductor chips 100 can be improved. Similarly, since the current sense 220 is formed only on one second semiconductor chip 200, the area efficiency of the remaining second semiconductor chips 200 can be improved.

Further, the temperature sense 120 is formed only on the first semiconductor chip 100 where the temperature is most likely to be highest. For this reason, while detecting the highest temperature among the first semiconductor chips 100, the area can be effectively used in the other first semiconductor chips 100.

Seventh Embodiment

A seventh embodiment will be described. Since the seventh embodiment provides a double-sided heat radiation structure with respect to the first embodiment, and the other features are the same as those of the first embodiment, description thereof is omitted here.

Figure 18:
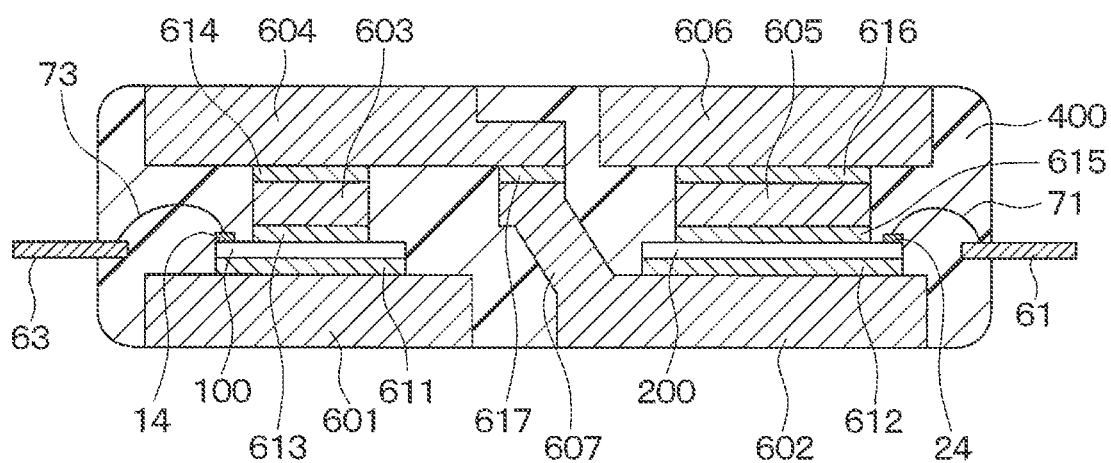
FIG. 18 is a cross-sectional view of a semiconductor device according to a seventh embodiment.

In the present embodiment, as shown in FIG. 18, the drain electrode 12 side of the first semiconductor chip 100 is connected to the first lower heat sink 601 via a bonding member 611. In FIG. 18 the drain electrode 22 and the like are not shown. The second semiconductor chip 200 on the drain electrode 22 side is connected to the second lower heat sink 602 via the bonding member 612.

Further, a first metal block 603 having a rectangular parallelepiped shape is mounted on the first semiconductor chip 100 via a bonding member 613, and a first upper heat sink 604 is provided on the first metal block 603 via a bonding member 614. The first metal block 603 is disposed on the source electrode 11 formed on the first semiconductor chip 100 and has a planar shape substantially equal to the planar shape of the source electrode 11.

Further, a second metal block 605 having a rectangular parallelepiped shape is mounted on the second semiconductor chip 200 via a bonding member 615, and a second upper heat sink 606 is provided on the second metal block 605 via a bonding member 616. The second metal block 605 is disposed on the source electrode 21 formed on the second semiconductor chip 200 and has a planar shape substantially equal to the planar shape of the source electrode 21.

That is, in the present embodiment, the first semiconductor chip 100 is disposed between the first lower heat sink 601 and the first upper heat sink 604 that are disposed to face each other. Further, the second semiconductor chip 200 is disposed between the second lower heat sink 602 and the second upper heat sink 606 that are disposed to face each other. The first upper heat sink 604 and the second lower heat sink 602 are connected by an intermediate member 607. In the present embodiment, the intermediate member 607 is formed integrally with the second lower heat sink 602, and is connected to the first upper heat sink 604 via the bonding member 617.

The first lower heat sink 601, the second lower heat sink 602, the first upper heat sink 604, the second upper heat sink 606, the first metal block 603, and the second metal block 605 are configured to be made of, for example, Cu or the like. Further, each of the bonding members 611 to 617 is configured to made of, for example, solder.

The gate pad 14 of the first semiconductor chip 100 is electrically connected to the third control terminal 63 via a bonding wire 73. The gate pad 24 of the second semiconductor chip 200 is electrically connected to the first control terminal 61 via the bonding wire 71.

A second control terminal 62 that is electrically connected to the source electrode 21 of the second semiconductor chip 200 is disposed in a different cross section from FIG. 18, and a JFET adjustment resistor 42 is disposed between the second control terminal 62 and the third control terminal 63. In the cross section different from that in FIG. 18, the first lower heat sink 601 is connected to the first terminal 31, and the second upper heat sink 606 is connected to the second terminal 32. Alternatively, the first terminal 31 may be configured by a part of the first lower heat sink 601, and the second terminal 32 may be configured by a part of the second upper heat sink 606. Further, the intermediate member 607 may be configured as a separate member from the second lower heat sink 602 and may be bonded to the second lower heat sink 602 via a bonding member. Furthermore, the intermediate member 607 may be integrated with the first upper heat sink 604 and bonded to the second lower heat sink 602 via a bonding member.

The mold resin 400 is provided such that a portion of the first lower heat sink 601 and the first upper heat sink 604 opposite to the first semiconductor chip 100 side is exposed. The mold resin 400 is provided such that a portion of the second lower heat sink 602 and the second upper heat sink 606 opposite to the second semiconductor chip 200 is exposed. Accordingly, in the present embodiment, the heat generated in the first and second semiconductor chips 100 and 200 are radiated from portions of the first and second lower heat sinks 601 and 602 and the first and second upper heat sinks 604 and 606 exposed from the mold resin 400. That is, the semiconductor device of this embodiment has a so-called double-sided heat radiation structure.

Even with such a configuration, the circuit configuration shown in FIG. 1 can be realized, and the same effect as in the first embodiment can be obtained. In addition, the double-sided heat dissipation structure facilitates to discharge the heat from the first semiconductor chip 100 and the second semiconductor chip 200, and the first semiconductor chip 100 and the second semiconductor chip 200 are restricted from being destroyed due to a high temperature.

Although the first lower heat sink 601 and the second lower heat sink 602 are provided here, the first semiconductor chip 100 and the second semiconductor chip 200 may have the substrate 300 and be mounted on the substrate 300 as in the first embodiment.

Eighth Embodiment

An eighth embodiment will be described hereafter. In the eighth embodiment, the first semiconductor chip 100 and the second semiconductor chip 200 are stacked and arranged with respect to the seventh embodiment, and the other features are the same as those in the first embodiment, so that the explanation thereof is skipped.

Figure 19:
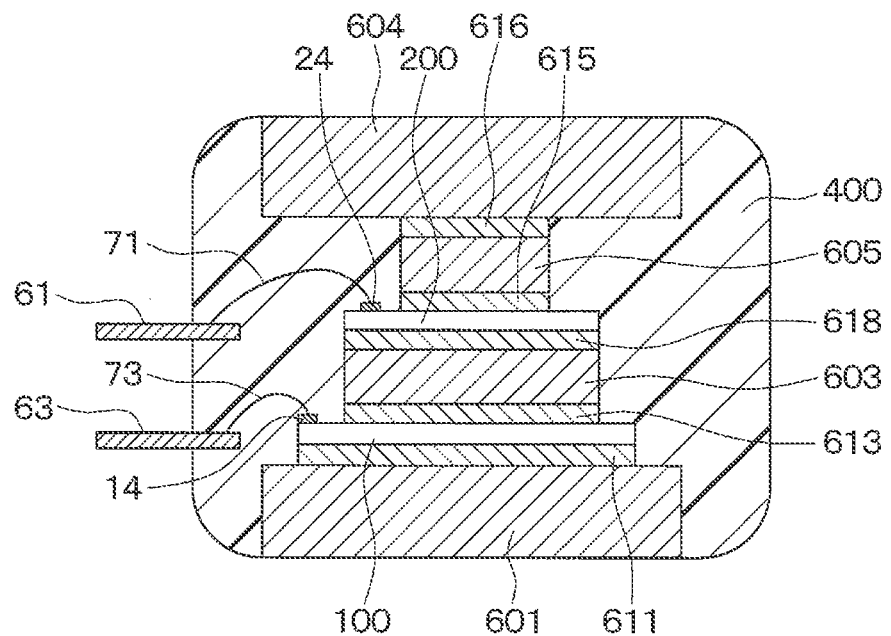
FIG. 19 is a cross-sectional view of a semiconductor device according to an eighth embodiment.

In the present embodiment, as shown in FIG. 19, the first semiconductor chip 100 is stacked on the lower heat sink 601 via the bonding member 611, and a metal block 603 is arranged on the first semiconductor chip 100 via the bonding member 613. Then, on the first metal block 603, the second semiconductor chip 200 is disposed via a bonding member 618 made of solder or the like. That is, the second semiconductor chip 200 is stacked on the first semiconductor chip 100. A second metal block 605 is disposed on the second semiconductor chip 200 via a bonding member 615, and an upper heat sink 604 is disposed on the second metal block 605 via a bonding member 616.

In the present embodiment, the first semiconductor chip 100 has a larger planar shape than the second semiconductor chip 200. The first semiconductor chip 100 is arranged such that the gate pad 14 is positioned outside the second semiconductor chip when viewed from the stacking direction of the first semiconductor chip 100 and the second semiconductor chip 200.

The first semiconductor chip 100 is connected to the third control terminal 63 via the bonding wire 73. The second semiconductor chip 200 is connected to the first control terminal 61 via the bonding wire 71. In the present embodiment, as in the seventh embodiment, the second control terminal 62 that is electrically connected to the source electrode 21 of the second semiconductor chip 200 is arranged in a cross section different from that in FIG. 19. A JFET adjustment resistor 42 is disposed between the second control terminal 62 and the third control terminal 63.

The mold resin 400 is provided such that portions of the lower heat sink 601 and the upper heat sink 604 opposite to the first and second semiconductor chips 100, 200 are exposed.

As described above, even when the first semiconductor chip 100 and the second semiconductor chip 200 are stacked and arranged, the same effects as in the seventh embodiment can be obtained.

Ninth Embodiment

A ninth embodiment will be described hereafter. The ninth embodiment is different from the eighth embodiment in that the first semiconductor chip 100 is smaller than the second semiconductor chip 200, and the other features are the same as those of the eighth embodiment, and thus the description thereof is omitted here.

Figure 20:
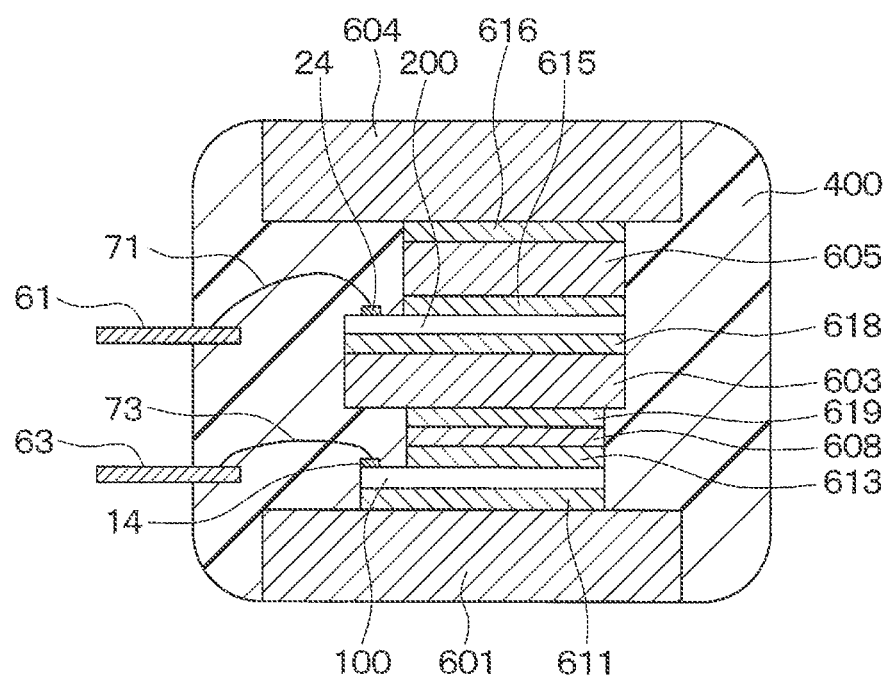
FIG. 20 is a cross-sectional view of a semiconductor device according to a ninth embodiment.

In the present embodiment, as shown in FIG. 20, the first semiconductor chip 100 is smaller than the second semiconductor chip 200. For this reason, when the rectangular parallelepiped first metal block 603 is arranged on the first semiconductor chip 100 as it is and the second semiconductor chip 200 is arranged on the first metal block 603, the following configuration is obtained. That is, a part of the drain electrode 22 of the second semiconductor chip 200 is not connected to the first metal block 603. In this case, an electrical and mechanical connection failure may occur between the first metal block 603 and the second semiconductor chip 200.

For this reason, in this embodiment, the spacer 608 is disposed between the first semiconductor chip 100 and the first metal block 603. The first metal block 603 is bonded to the spacer 608 via a bonding member 619 made of solder or the like.

The spacer 608 is made of Cu or the like, and has a planar shape corresponding to the first semiconductor chip 100. Specifically, the spacer 608 has a planar shape substantially equal to the size of the source electrode 11 in the first semiconductor chip 100. Further, the first metal block 603 has a planar shape corresponding to the second semiconductor chip 200. Specifically, the first metal block 603 has a planar shape substantially equal to the size of the drain electrode 22 in the second semiconductor chip 200. Thereby, the second semiconductor chip 200 is reliably bonded to the first metal block 603, and the electrical and mechanical connection failure is restricted from occurring.

In the present embodiment, as in the seventh embodiment, the second control terminal 62 that is electrically connected to the source electrode 21 of the second semiconductor chip 200 is arranged in a cross section different from that in FIG. 20. A JFET adjustment resistor 42 is disposed between the second control terminal 62 and the third control terminal 63.

As described above, in the present embodiment, the planar shape of the first semiconductor chip 100 is smaller than that of the second semiconductor chip 200, and a spacer 608 is arranged between the first semiconductor chip 100 and the first metal block 603. For this reason, it is possible to secure a sufficient junction area between the first metal block 603 and the drain electrode 22 in the second semiconductor chip 200.

In addition, by arranging the spacer 608, the interval between the first semiconductor chip 100 and the first metal block 603 can be increased. For this reason, it is possible to secure the space where the bonding wire 73, which connects the gate pad 14 of the first semiconductor chip 100 and the third control terminal 63, is arrange.

Further, the first semiconductor chip 100 having a smaller planar shape than the second semiconductor chip 200 may be used, and the degree of freedom in design can be improved.

Tenth Embodiment

A tenth embodiment will be described. In the tenth embodiment, the semiconductor devices of the seventh embodiment are arranged side by side, and the others are the same as those in the seventh embodiment, and therefore, the description thereof is omitted here.

Figure 21:
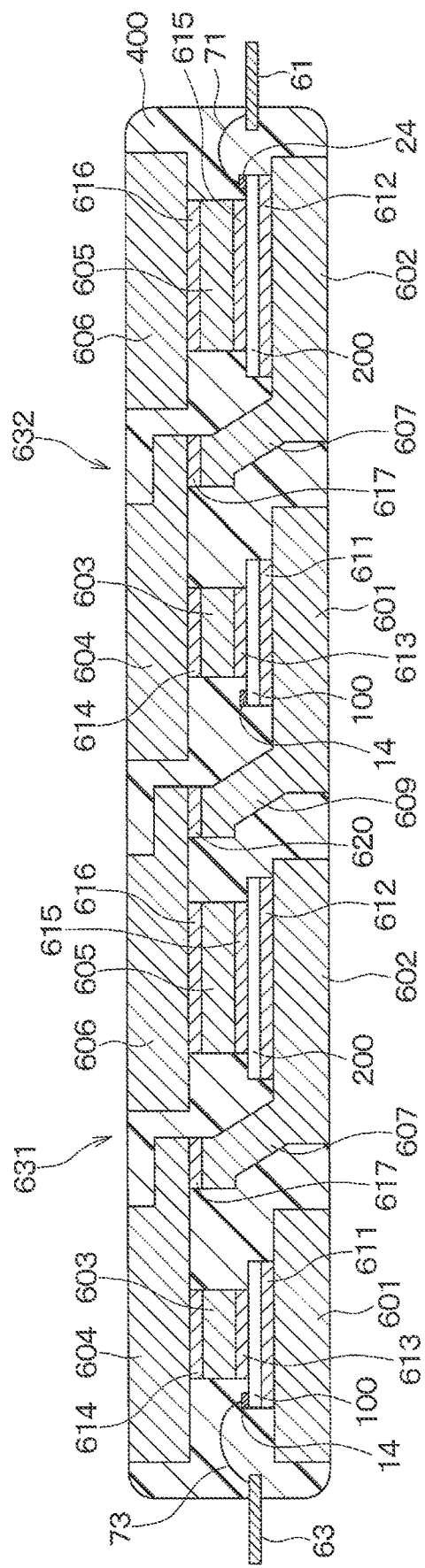
FIG. 21 is a cross-sectional view of a semiconductor device according to a tenth embodiment.

In the present embodiment, as shown in FIG. 21, the features other than the mold resin 400 described in the seventh embodiment are configuration members, and two configuration members 631 and 632 are arranged side by side. And each configuration member 631,632 is sealed with the mold resin 400.

In addition, the second upper heat sink 606 in the configuration member 631 and the first lower heat sink 601 in the configuration member 632 are connected by an intermediate member 609. In the present embodiment, the intermediate member 609 is formed integrally with the first lower heat sink 601 in the configuration member 632, and is bonded to the first upper heat sink 604 in the configuration member 631 via the bonding member 620.

The intermediate member 609 may be configured as a separate member from the first lower heat sink 601 in the configuration member 632 and may be bonded to the first lower heat sink 601 in the configuration member 632 via a bonding member. Further, the intermediate member 609 may be integrated with the first upper heat sink 604 in the configuration member 631 and bonded to the first lower heat sink 601 in the configuration member 632 via a bonding member. Furthermore, in a cross section different from that in FIG. 21, first and second control terminals 61 and 62 connected to the second semiconductor chip 200 of the configuration member 631 are arranged. Further, a third control terminal 63 connected to the first semiconductor chip 100 of the configuration member 632 and a second control terminal 62 connected to the second semiconductor chip 200 of the configuration member 632 are arranged. A JFET adjustment resistor 42 is disposed between the second control terminal 62 and the third control terminal 63 in each of the configuration members 631 and 632.

In this manner, a semiconductor device including two configuration members 631 and 632 may be used. In addition, although the structure provided with the two configuration members 631 and 632 is explained here, a plurality configuration members may be further provided.

Eleventh Embodiment

An eleventh embodiment will be described. In the eleventh embodiment, the semiconductor devices of the eighth embodiment are arranged side by side, and the others are the same as those in the eighth embodiment, and therefore, the description thereof is omitted here.

Figure 22:
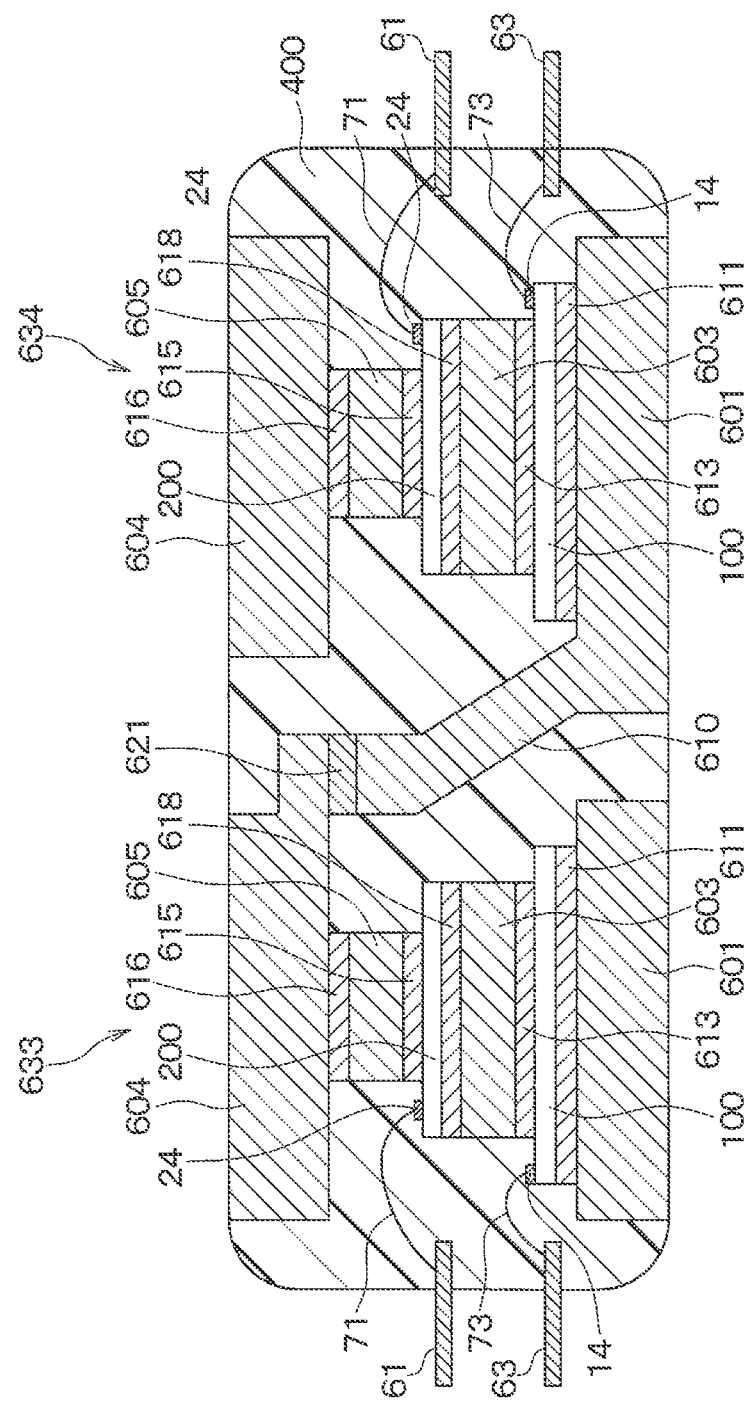
FIG. 22 is a cross-sectional view of a semiconductor device according to an eleventh embodiment.

In the present embodiment, as shown in FIG. 22, the features other than the mold resin 400 described in the eighth embodiment are configuration members, and two configuration members 633 and 634 are arranged side by side. And each configuration member 633, 634 is sealed with the mold resin 400.

In addition, the upper heat sink 604 in the configuration member 633 and the lower heat sink 601 in the configuration member 634 are connected by an intermediate member 610. In the present embodiment, the intermediate member 610 is formed integrally with the lower heat sink 601 in the configuration member 634, and is bonded to the upper heat sink 604 in the configuration member 633 via the bonding member 621.

The intermediate member 610 may be configured as a separate member from the lower heat sink 601 in the configuration member 634 and may be bonded to the lower heat sink 601 in the configuration member 634 via a bonding member. Further, the intermediate member 610 may be integrated with the upper heat sink 604 in the configuration member 633 and bonded to the lower heat sink 601 in the configuration member 634 via a bonding member. Furthermore, the second control terminals 62 connected to the second semiconductor chips 200 of the constituent members 633 and 634 are arranged in a cross section different from FIG. 22. A JFET adjustment resistor 42 is disposed between the second control terminal 62 and the third control terminal 63 in each of the configuration members 633 and 634.

In this manner, a semiconductor device including two configuration members 633 and 634 may be used. In addition, although the structure provided with the two configuration members 633 and 634 is explained here, a plurality configuration members may be further provided.

Twelfth Embodiment

A twelfth embodiment will be described. In the present embodiment, the configuration of the MOSFET adjustment resistor 41 is changed with respect to the first embodiment, and the other features are the same as those in the first embodiment, and thus the description thereof is omitted here.

Figure 23:
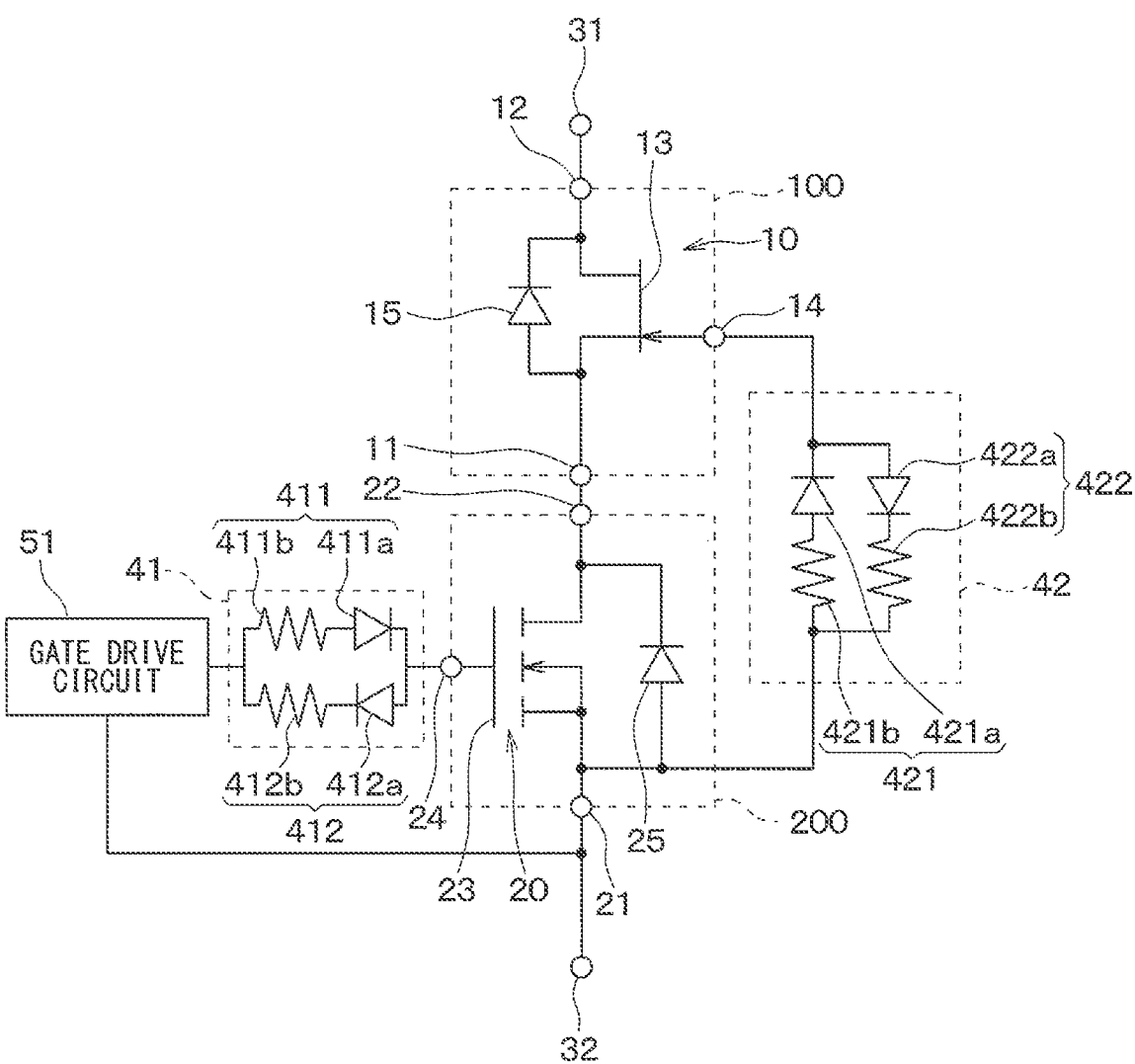
FIG. 23 is a circuit diagram of a semiconductor device according to a twelfth embodiment.

In the present embodiment, as shown in FIG. 23, the MOSFET adjustment resistor 41 has the following configuration. That is, the MOSFET adjustment resistor 41 includes a third resistance circuit 411 in which a third diode 411*a* and a third resistor 411*b* are connected in series, and a fourth resistance circuit 412 in which a fourth diode 412*a* and a fourth resistor 412*b* are connected in series. The third resistance circuit 411 and the fourth resistance circuit 412 are arranged in parallel so that the cathode of the third diode 411*a* and the anode of the fourth diode 412*a* are connected to the gate layer 23 of the MOSFET 20, respectively.

The MOSFET adjustment resistor 41 according to the present embodiment is a packaged component including the third resistance circuit 411 and the fourth resistance circuit 412, and is an external component configured by a different component from the first semiconductor chip 100 and the second semiconductor chip 200. That is, the MOSFET adjustment resistor 41 is disposed so as to be exposed from the mold resin 400. For this reason, the MOSFET adjustment resistor 41 whose resistance value is adjusted can be easily attached and detached and replaceable according to the application.

In the present embodiment, the fourth resistor 412*b* has a larger resistance than the third resistor 411*b*. Specifically, the fourth resistor 412*b* controls the switching speed when the semiconductor device turns on as will be described later, and has a resistance value corresponding to a desired and required application.

In the present embodiment, the gate electrode 23 of the MOSFET 20 and the gate drive circuit 51 are connected via the MOSFET adjustment resistor 41. For this reason, the switching speed of the MOSFET 20 is adjusted by different resistance circuits between a case of the switching on operation and a case of the switching off operation.

Specifically, the gate electrode 23 of the MOSFET 20 is connected to the gate drive circuit 51 via the third resistance circuit 411 when the switching-on operation is performed. That is, the third resistance circuit 411 functions as a speed adjustment resistor for switching-on operation of the MOSFET 20. Further, the gate electrode 23 of the MOSFET 20 is connected to the gate drive circuit 51 via the fourth resistance circuit 412 when the switching-off operation is performed. That is, the fourth resistance circuit 412 functions as a speed adjustment resistor for switching-off operation of the MOSFET 20. For this reason, the switching speed of the MOSFET 20 can be appropriately adjusted by adjusting the resistance values of the resistance circuits 411 and 412.

The above description is the configuration of the semiconductor device in this embodiment. Such a semiconductor device is used as a switching element of an inverter circuit that drives a three-phase motor, for example, as shown in FIG. 24.

Figure 24:
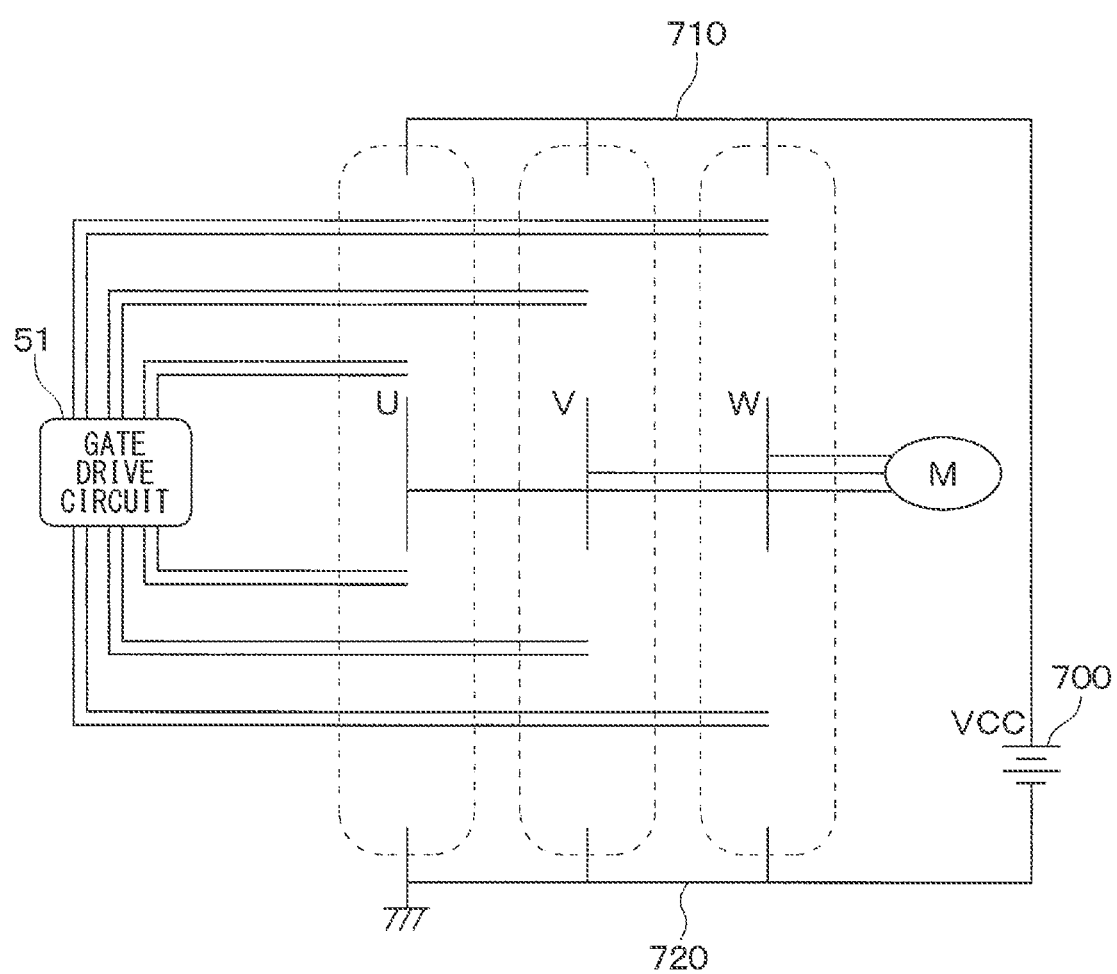
FIG. 24 is a circuit diagram of an inverter circuit.
Figure 25:
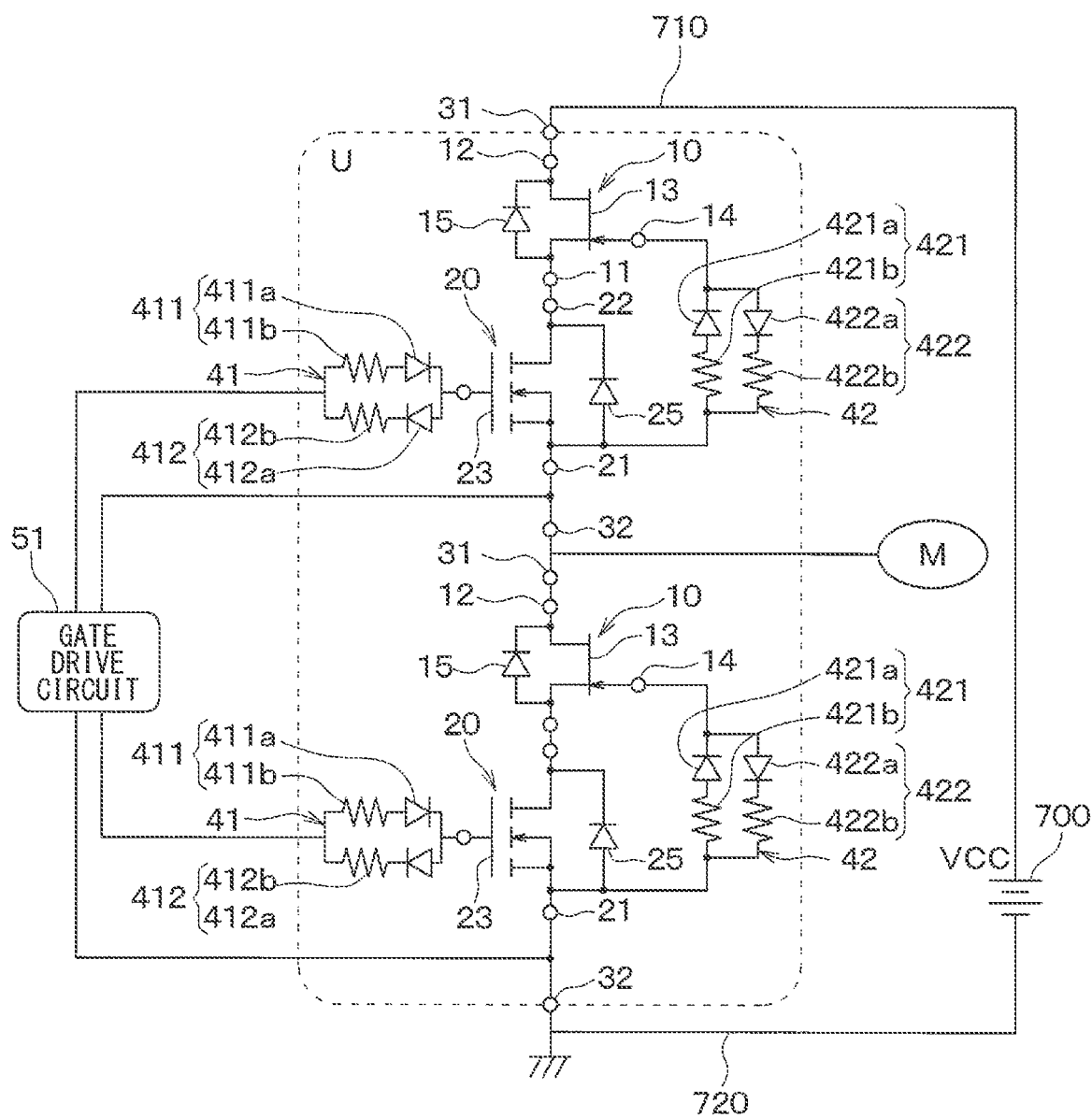
FIG. 25 is a circuit diagram of a U layer in FIG. 24.

That is, as shown in FIG. 24, the inverter circuit includes three circuits of three phases of U phase, V phase, and W phase between a power supply line 710 to which the voltage Vcc from the power supply 700 is applied and a ground line 720 connected to the ground. Each layer is connected to the gate drive circuit 51 and the three-phase motor M, respectively. Hereinafter, the detailed configuration of the U layer will be described with reference to FIG. 25. Note that the detailed configuration of the V layer and the W layer is the same as that of the U layer, and is omitted to explain. In FIG. 25, for easy understanding, the surrounding lines indicating the first semiconductor chip 100, the second semiconductor chip 200, the MOSFET adjustment resistor 41, the JFET adjustment resistor 42, and the like are not shown.

As shown in FIG. 25, the U layer is configured to include two semiconductor devices shown in FIG. 23. In the U layer, the drain electrode 12 of the JFET 10 in the upper arm is connected to the power supply line 710 via the first terminal 31, and the source electrode 21 of the MOSFET 20 in the lower arm is connected to the ground line 720 via the second terminal 32. In the MOSFET 20 in the upper arm, the source electrode 21 is electrically connected to the drain electrode 12 of the JFET 10 in the lower arm. That is, the second terminal 32 of the upper arm is electrically connected to the first terminal 31 of the lower arm. The three-phase motor M is connected between the second terminal 32 of the upper arm and the first terminal 31 of the lower arm. In each MOSFET 20 in the upper arm and the lower arm, the gate electrode 23 is connected to the gate drive circuit 51.

As described above, the semiconductor device of this embodiment may also be used as a switching element of an inverter circuit.

As described above, in the present embodiment, the gate electrode 23 of the MOSFET 20 is connected to the gate drive circuit 51 via the third resistance circuit 411 when the switching-on operation is performed. Further, the gate electrode 23 of the MOSFET 20 is connected to the gate drive circuit 51 via the fourth resistance circuit 412 when the switching-off operation is performed. For this reason, when the semiconductor device switches on and switches off, the semiconductor device is adjusted to have a desired switching speed for each case. Accordingly, a more reliable semiconductor device can be obtained.

In the above, the example in which the semiconductor device of the twelfth embodiment is used for the inverter circuit that drives the three-phase motor M has been described. Of course, the semiconductor device of the first embodiment may be also used for an inverter circuit that drives the three-phase motor M.

Thirteenth Embodiment

A thirteenth embodiment will be described. The present embodiment is different from the twelfth embodiment in the configuration of the MOSFET adjustment resistor 41 and the JFET adjustment resistor 42, and the other features are the same as those in the second embodiment, so that the description will be omitted here.

Figure 26:
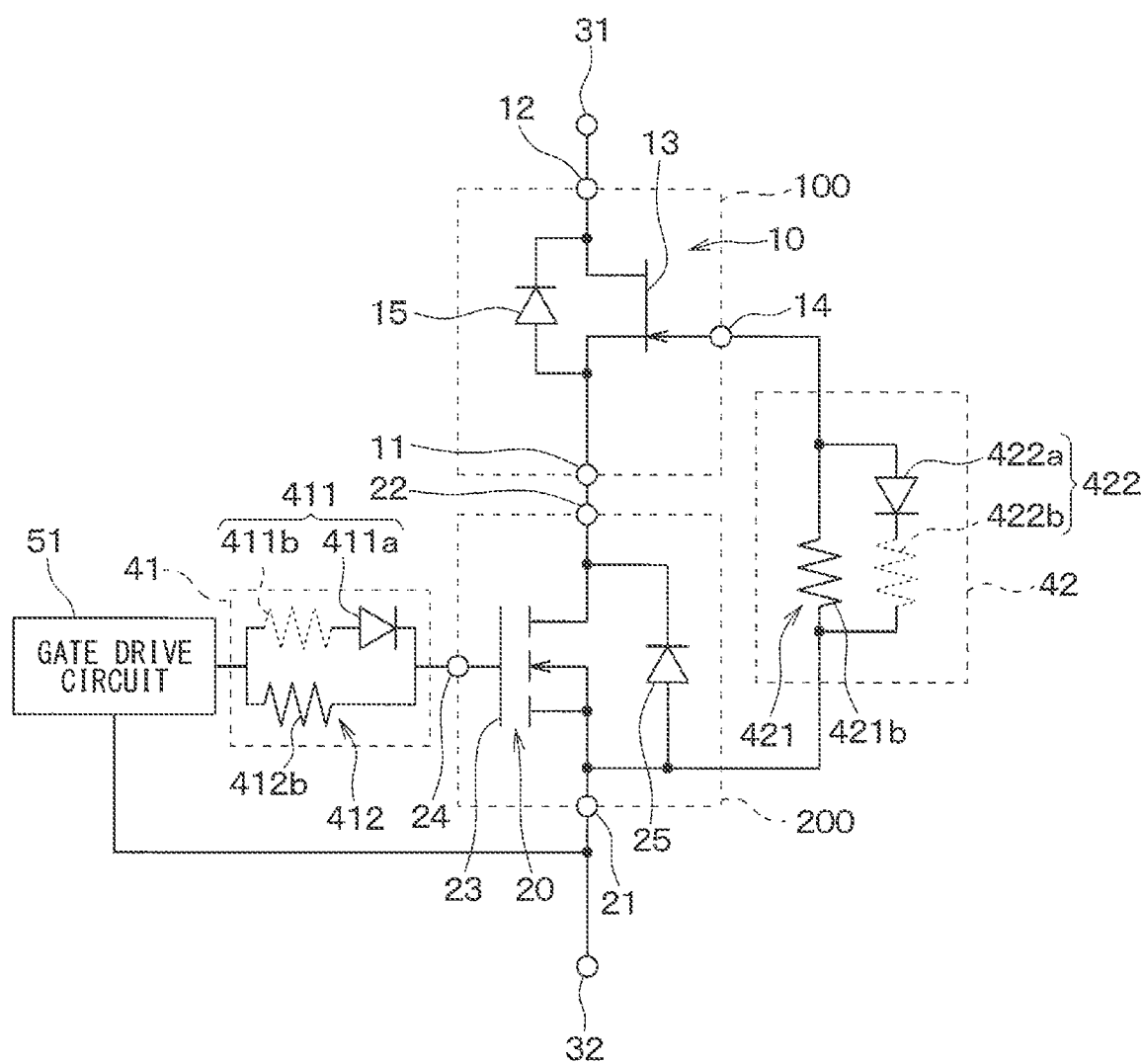
FIG. 26 is a circuit diagram of a semiconductor device according to a thirteenth embodiment.

In the present embodiment, as shown in FIG. 26, the basic configuration of the semiconductor device is the same as that of the twelfth embodiment. However, in the present embodiment, the JFET adjustment resistor 42 is configured such that the second resistor 422b is formed of a wiring resistance, a parasitic resistance, or the like, and no external resistor is used. For example, the first resistor 421b has several tens to several hundreds Ω, and the second resistor 422b has an order of several Ω.

Further, in the MOSFET adjustment resistor 41, the third resistor 411b is formed of a wiring resistance, a parasitic resistance, or the like, and no external resistor is used. For example, the third resistor 411b is set to several Ω, and the fourth resistor 412b is set to several tens to several hundreds Ω.

In the present embodiment, in the JFET adjustment resistor 42, the first diode 421a is not provided in the first resistor circuit 421. Similarly, in the MOSFET adjustment resistor 41, the fourth resistor circuit 412 does not include the fourth diode 412a.

In such a semiconductor device, the second resistor 422b has a smaller value than the first resistor 421b. For this reason, when the JFET 10 performs the switching-off operation, the gate layer 13 of the JFET 10 is substantially connected to the source electrode of the MOSFET 20 via the second resistor 422b without arranging the first diode 421a in the first resistor circuit 421. Similarly, the third resistor 411b has a smaller value than the fourth resistor 412b. Therefore, when the MOSFET 20 performs the switching on operation, the gate electrode 23 of the MOSFET 20 is substantially connected to the gate drive circuit 51 via the third resistor 411b without arranging the fourth diode 412a.

For this reason, according to the present embodiment, the same effects as those of the twelfth embodiment can be obtained while reducing the number of components. The present embodiment can be applied to only one of the MOSFET adjustment resistor 41 and the JFET adjustment resistor 42. That is, for example, the first diode 421a may not be disposed in the first resistance circuit 421 of the JFET adjustment resistor 42, and the fourth diode 412a may be disposed in the fourth resistance circuit 412 of the MOSFET adjustment resistor 41. Alternatively, the MOSFET adjustment resistor 41 may be formed of only a resistance component as in the first embodiment.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the scope and the scope of the present disclosure.

For example, in each of the above embodiments, the first semiconductor chip 100 (that is, the JFET 10) may be configured not to include the body layer 116.

In each of the above embodiments, the body layer 116 may not be deeper than the gate layer 13 as long as the electric field strength tends to be higher on the bottom side of the body layer 116 than on the bottom side of the gate layer 13. For example, when the bottom of the body layer 116 may be tapered or the width of the body layer 116 may be narrower than the width of the gate layer 13, the electric field strength tends to be higher on the bottom side of the body layer 116 than on the bottom side of the gate layer 13. In addition, when the region connected to the bottom surface of the body layer 116 is an N type region having a higher impurity concentration than the region connected to the bottom surface of the gate layer 13, the electric field strength tends to be higher on the bottom side of the body layer 116 than on the bottom side of the gate layer 13.

Further, in each of the above embodiments, the configuration of the JFET adjustment resistor 42 may be changed. For example, a switch may be provided so that the gate current is adjusted by the first resistor 421b when the semiconductor device performs the switching on operation and the gate current is adjusted by the second resistor 422b when the semiconductor device performs the switching off operation.

In each of the above embodiments, the JFET 10 and the MOSFET 20 may be appropriately P-channel type.

Furthermore, in the second embodiment, the first semiconductor chip 100 and the second semiconductor chip 200 may include a temperature sense 120, a current sense 220, and the like, respectively.

In the third embodiment, since the temperature of the first semiconductor chip 100 is likely to be higher than that of the second semiconductor chip 200, the overheat protection circuit 51b may determine only the temperature of the first semiconductor chip 100 calculated by the temperature calculation circuit 51a.

In the sixth embodiment, the temperature sense 120 and the temperature sense pads 121 and 122 may be formed in each first semiconductor chip 100, respectively. Each second semiconductor chip 200 may include a current sense 220, a current sense pad 221, and a Kelvin source pad 222.

Furthermore, in the ninth embodiment, the first metal block 603 and the spacer 608 may be integrated with each other. For example, the first metal block 603 may have a protruding portion that functions as the spacer 608 by appropriately cutting or polishing a portion on the first semiconductor chip 100 side.

In each of the above embodiments, the JFET 10 may be configured to be a normally off type device, and the MOS-FET 20 may be configured to be a normally on type device.

Further, in each of the above embodiments, the JFET adjustment resistor 42 may be disposed in the mold resin 400 as long as the resistor 42 has the first resistance circuit 421 and the second resistance circuit 422.

In the first to twelfth embodiments, the first resistor 421*b* and the second resistor 422*b* may have the same size, or the first resistor 421*b* may be smaller than the second resistor 422*b*. Similarly, in the twelfth embodiment, the third resistor 411*b* and the fourth resistor 412*b* may have the same size, or the third resistor 411*b* may be smaller than the fourth resistor 412*b*.

Moreover, said each embodiment may be combined suitably. For example, the second embodiment may be combined with the seventh to thirteenth embodiments to provide the temperature sense 120, the current sense 220, and the like. Similarly, the third embodiment may be combined with the sixth to thirteenth embodiments so that the temperature sense 120, the current sense 220, and the like are arranged in the second semiconductor chip 200. Further, the fifth and sixth embodiments may be combined with the seventh to thirteenth embodiments, and a plurality of first semiconductor chips 100 and second semiconductor chips 200 may be provided. The seventh to eleventh embodiments may be combined with the twelfth and thirteenth embodiments. Further, a combination of the above embodiments may be further combined.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a first semiconductor chip including a junction-type FET;
   a second semiconductor chip including a MOSFET; and
   a junction-type FET adjustment resistor disposed between a gate electrode of the junction-type FET and a source electrode of the MOSFET, wherein:
   the junction type FET and the MOSFET are cascode-connected by electrically connecting a source electrode of the junction type FET and a drain electrode of the MOSFET; and
   the junction-type FET adjustment resistor includes a first resistance circuit for a switching on operation and a second resistance circuit for a switching off operation,
   the semiconductor device further comprising:
   a lower heat sink and an upper heat sink arranged to be opposed to each other; and
   a mold resin for sealing the first semiconductor chip and the second semiconductor chip, wherein:
   the first semiconductor chip and the second semiconductor chip are stacked and disposed between the lower heat sink and the upper heat sink;
   the mold resin seals the first semiconductor chip and the second semiconductor chip in a state that a portion of the lower heat sink and a portion of the upper heat sink respectively opposite to the first semiconductor chip and the second semiconductor chip are exposed from the mold resin;
   the first semiconductor chip has a smaller planar shape than the second semiconductor chip;
   a spacer is arranged between the first semiconductor chip and the second semiconductor chip;
   the spacer is disposed on a first semiconductor chip side, is connected to the first semiconductor chip, and has a shape corresponding to a planar shape of the first semiconductor chip;
   a metal block is arranged between the spacer and the second semiconductor chip; and
   the metal block is connected to the second semiconductor chip, and has a shape corresponding to a planar shape of the second semiconductor chip.

2. The semiconductor device according to claim 1, further comprising:
   a mold resin for sealing the first semiconductor chip and the second semiconductor chip, wherein:
   the junction-type FET adjustment resistor is arranged to be exposed from the mold resin.

3. The semiconductor device according to claim 1, wherein:
   the first resistance circuit includes a first diode and a first resistor;
   the first diode and the first resistor are connected to each other in series;
   the second resistance circuit includes a second diode and a second resistor;
   the second diode and the second resistor are connected to each other in series;
   the first resistance circuit and the second resistance circuit are connected to each other in parallel; and
   a cathode of the first diode and an anode of the second diode are connected to the gate electrode of the junction-type FET.

4. The semiconductor device according to claim 1, further comprising:
   a MOSFET adjustment resistor disposed between the gate electrode of the MOSFET and a gate drive circuit, wherein:
   the MOSFET adjustment resistor has a third resistance circuit for the switching-on operation and a fourth resistance circuit for the switching-off operation.

5. The semiconductor device according to claim 4, wherein:
   the third resistance circuit includes a third diode and a third resistor;
   the third diode and the third resistor are connected to each other in series;
   the fourth resistance circuit includes a fourth diode and a fourth resistor;
   the fourth diode and the fourth resistor are connected to each other in series;
   the third resistance circuit and the fourth resistance circuit are connected to each other in parallel; and
   a cathode of the third diode and an anode of the fourth diode are connected to the gate electrode of the MOSFET.

6. The semiconductor device according to claim 1, wherein:
   the first semiconductor chip includes:
   a drift layer having a first conductivity type;
   a channel layer having the first conductivity type and disposed on the drift layer;

a source layer having the first conductivity type with an impurity concentration higher than the channel layer and arranged in a surface portion of the channel layer;

a gate layer as the gate electrode having a second conductivity type and arranged in the channel layer to be deeper than the source layer;

a drain layer disposed on an opposite side of the source layer with respect to the drift layer sandwiched therebetween;

a gate wiring electrically connected to the gate layer;

the source electrode electrically connected to the source layer; and a drain electrode electrically connected to the drain layer, wherein:

the channel layer includes a body layer having the second conductivity type, arranged to be deeper than the source layer, and electrically connected to the source electrode.

7. The semiconductor device according to claim 6, wherein:

an electric field strength on a bottom side of the body layer is higher than on a bottom side of the gate layer.

8. A semiconductor device comprising:

a first semiconductor chip including a junction-type FET;

a second semiconductor chip including a MOSFET; and a junction-type FET adjustment resistor disposed between a gate electrode of the junction-type FET and a source electrode of the MOSFET, wherein:

the junction type FET and the MOSFET are cascode-connected by electrically connecting a source electrode of the junction type FET and a drain electrode of the MOSFET;

the junction-type FET adjustment resistor includes a first resistance circuit for a switching on operation and a second resistance circuit for a switching off operation;

one of the first semiconductor chip and the second semiconductor chip includes a temperature sense for detecting temperature;

the other of the first semiconductor chip and the second semiconductor chip includes a current sense for detecting current;

a gate voltage obtained based on a detection result of the current sense and a detection result of the temperature sense is applied to the gate electrode of the MOSFET;

the first semiconductor chip has an on-state resistance higher than the second semiconductor chip; and the temperature sense is arranged in the first semiconductor chip.

9. The semiconductor device according to claim 8, wherein:

the first semiconductor chip is made of a silicon carbide substrate;

the second semiconductor chip is made of a silicon substrate; and the current sense is arranged in the second semiconductor chip.

10. The semiconductor device according to claim 8, further comprising:

a first lower heat sink and a first upper heat sink arranged to be opposed to each other;

a second lower heat sink and a second upper heat sink arranged to be opposed to each other; and a mold resin for sealing the first semiconductor chip and the second semiconductor chip, wherein:

the first semiconductor chip is disposed between the first lower heat sink and the first upper heat sink, and is electrically and thermally connected to the first lower heat sink and the first upper heat sink;

the second semiconductor chip is disposed between the second lower heat sink and the second upper heat sink, and is electrically and thermally connected to the second lower heat sink and the second upper heat sink; and the first upper heat sink and the second lower heat sink are electrically connected to each other; and the mold resin seals the first semiconductor chip and the second semiconductor chip in a state that a portion of the first lower heat sink and a portion of the first upper heat sink opposite to the first semiconductor chip are exposed from the mold resin, and a portion of the second lower heat sink and a portion of the second upper heat sink opposite to the second semiconductor chip are exposed from the mold resin.

11. The semiconductor device according to claim 8, further comprising:

a lower heat sink and an upper heat sink arranged to be opposed to each other;

a mold resin for sealing the first semiconductor chip and the second semiconductor chip, wherein:

the first semiconductor chip and the second semiconductor chip are stacked and disposed between the lower heat sink and the upper heat sink; and the mold resin seals the first semiconductor chip and the second semiconductor chip in a state that a portion of the lower heat sink and a portion of the upper heat sink respectively opposite to the first semiconductor chip and the second semiconductor chip are exposed from the mold resin.

12. The semiconductor device according to claim 11, wherein:

the first semiconductor chip has a smaller planar shape than the second semiconductor chip;

a spacer is arranged between the first semiconductor chip and the second semiconductor chip;

the spacer is disposed on a first semiconductor chip side, is connected to the first semiconductor chip, and has a shape corresponding to a planar shape of the first semiconductor chip;

a metal block is arranged between the spacer and the second semiconductor chip; and the metal block is connected to the second semiconductor chip, and has a shape corresponding to a planar shape of the second semiconductor chip.

13. A semiconductor device comprising:

a first semiconductor chip including a junction-type FET;

a second semiconductor chip including a MOSFET; and a junction-type FET adjustment resistor disposed between a gate electrode of the junction-type FET and a source electrode of the MOSFET, wherein:

the junction type FET and the MOSFET are cascode-connected by electrically connecting a source electrode of the junction type FET and a drain electrode of the MOSFET;

the junction-type FET adjustment resistor includes a first resistance circuit for a switching on operation and a second resistance circuit for a switching off operation, one of the first semiconductor chip and the second semiconductor chip includes a temperature sense for detecting temperature;

the other of the first semiconductor chip and the second semiconductor chip includes a current sense for detecting current;

a gate voltage obtained based on a detection result of the current sense and a detection result of the temperature sense is applied to the gate electrode of the MOSFET;

the first semiconductor chip has an on-state resistance higher than the second semiconductor chip; and the temperature sense is arranged in the second semiconductor chip;

the semiconductor device further comprising:

a gate drive circuit for applying the gate voltage to the gate electrode of the MOSFET, wherein:

the gate driving circuit has a temperature calculation circuit for calculating the temperature of the first semiconductor chip based on the temperature detected by the temperature sense; and the gate voltage obtained further based on the temperature of the first semiconductor chip calculated by the temperature calculation circuit is applied.

14. The semiconductor device according to claim 13, wherein:

the first semiconductor chip is made of a silicon carbide substrate;

the second semiconductor chip is made of a silicon substrate; and the current sense is arranged in the second semiconductor chip.

15. The semiconductor device according to claim 13, further comprising:

a first lower heat sink and a first upper heat sink arranged to be opposed to each other;

a second lower heat sink and a second upper heat sink arranged to be opposed to each other; and a mold resin for sealing the first semiconductor chip and the second semiconductor chip, wherein:

the first semiconductor chip is disposed between the first lower heat sink and the first upper heat sink, and is electrically and thermally connected to the first lower heat sink and the first upper heat sink;

the second semiconductor chip is disposed between the second lower heat sink and the second upper heat sink, and is electrically and thermally connected to the second lower heat sink and the second upper heat sink; and the first upper heat sink and the second lower heat sink are electrically connected to each other; and the mold resin seals the first semiconductor chip and the second semiconductor chip in a state that a portion of the first lower heat sink and a portion of the first upper heat sink opposite to the first semiconductor chip are exposed from the mold resin, and a portion of the second lower heat sink and a portion of the second upper heat sink opposite to the second semiconductor chip are exposed from the mold resin.

16. The semiconductor device according to claim 13, further comprising:

a lower heat sink and an upper heat sink arranged to be opposed to each other;

a mold resin for sealing the first semiconductor chip and the second semiconductor chip, wherein:

the first semiconductor chip and the second semiconductor chip are stacked and disposed between the lower heat sink and the upper heat sink; and the mold resin seals the first semiconductor chip and the second semiconductor chip in a state that a portion of the lower heat sink and a portion of the upper heat sink respectively opposite to the first semiconductor chip and the second semiconductor chip are exposed from the mold resin.

17. The semiconductor device according to claim 16, wherein:

the first semiconductor chip has a smaller planar shape than the second semiconductor chip;

a spacer is arranged between the first semiconductor chip and the second semiconductor chip;

the spacer is disposed on a first semiconductor chip side, is connected to the first semiconductor chip, and has a shape corresponding to a planar shape of the first semiconductor chip;

a metal block is arranged between the spacer and the second semiconductor chip; and the metal block is connected to the second semiconductor chip, and has a shape corresponding to a planar shape of the second semiconductor chip.

* * * * *